(12) United States Patent
Chiang et al.

(10) Patent No.: US 10,506,258 B2
(45) Date of Patent: Dec. 10, 2019

(54) CODING VIDEO SYNTAX ELEMENTS USING A CONTEXT TREE

(71) Applicant: GOOGLE LLC, Mountain View, CA (US)

(72) Inventors: Ching-Han Chiang, San Jose, CA (US); Jingning Han, Santa Clara, CA (US); Yaowu Xu, Saratoga, CA (US)

(73) Assignee: GOOGLE LLC, Mountain View, CA (US)

( * ) Notice: Subject to any disclaimer, the term of this patent is extended or adjusted under 35 U.S.C. 154(b) by 14 days.

(21) Appl. No.: 15/648,500

(22) Filed: Jul. 13, 2017

(65) Prior Publication Data

US 2019/0020900 A1    Jan. 17, 2019

(51) Int. Cl.
| | |
|---|---|
| *H04N 11/02* | (2006.01) |
| *H04N 19/70* | (2014.01) |
| *H04N 19/176* | (2014.01) |
| *H04N 19/50* | (2014.01) |
| *H04N 19/44* | (2014.01) |
| *H04N 19/13* | (2014.01) |

(52) U.S. Cl.
CPC ............. *H04N 19/70* (2014.11); *H04N 19/13* (2014.11); *H04N 19/176* (2014.11); *H04N 19/44* (2014.11); *H04N 19/50* (2014.11)

(58) Field of Classification Search
CPC ..................................................... H04N 19/70
USPC ....................................... 375/240.01–240.29
See application file for complete search history.

(56) References Cited

U.S. PATENT DOCUMENTS

| | | | |
|---|---|---|---|
| 5,640,159 A | | 6/1997 | Furlan et al. |
| 6,084,908 A | * | 7/2000 | Chiang ............... G06T 7/20 348/E5.066 |
| 8,705,622 B2 | | 4/2014 | Ye et al. |

(Continued)

FOREIGN PATENT DOCUMENTS

WO    2012/167097 A1    12/2012

OTHER PUBLICATIONS

Danny Hong et al., "Arithmetic coding with adaptive context-tree weighting for the H.264 video coders", Visual Communications and Image Processing 2004, Proceedings of SPIE-IS&T, vol. 5308, pp. 1226-1235.

(Continued)

*Primary Examiner* — Leron Beck
(74) *Attorney, Agent, or Firm* — Young Basile Hanlon & MacFarlane, P.C.

(57) ABSTRACT

Video syntax elements are coded using a context tree. Context information used for coding previously-coded syntax elements is identified. A context tree is produced by separating the previously-coded syntax elements into data groups based on the context information. The context tree includes nodes representing the data groups. Separating the previously-coded syntax elements can include applying separation criteria against values of the context information to produce at least some of the nodes. Context information is then identified for another set of syntax elements to be coded. One of the nodes of the context tree is identified based on values of the context information associated with one of the other set of syntax elements. That syntax element is then coded according to a probability model associated with the identified node. The context tree can be used to encode or decode syntax elements.

20 Claims, 11 Drawing Sheets

(56) References Cited

U.S. PATENT DOCUMENTS

| | | | | |
|---|---|---|---|---|
| 10,123,028 | B2* | 11/2018 | Wu | H04N 19/436 |
| 2005/0074176 | A1* | 4/2005 | Marpe | H04N 19/196 |
| | | | | 382/239 |
| 2009/0257503 | A1 | 10/2009 | Ye et al. | |
| 2011/0310976 | A1* | 12/2011 | Wang | H04N 19/176 |
| | | | | 375/240.24 |
| 2012/0014454 | A1* | 1/2012 | Budagavi | H04N 19/91 |
| | | | | 375/240.16 |
| 2012/0026020 | A1* | 2/2012 | Korodi | H03M 7/4056 |
| | | | | 341/51 |
| 2012/0128064 | A1* | 5/2012 | Sato | H04N 19/70 |
| | | | | 375/240.03 |
| 2012/0308148 | A1* | 12/2012 | Kim | H04N 19/00 |
| | | | | 382/233 |
| 2012/0328003 | A1* | 12/2012 | Chien | H04N 19/176 |
| | | | | 375/240.03 |
| 2013/0034157 | A1* | 2/2013 | Helle | H04N 19/52 |
| | | | | 375/240.12 |
| 2013/0114735 | A1* | 5/2013 | Wang | H04N 19/176 |
| | | | | 375/240.23 |
| 2013/0188699 | A1* | 7/2013 | Joshi | H03M 7/4006 |
| | | | | 375/240.12 |
| 2013/0329784 | A1* | 12/2013 | Chuang | H04N 19/102 |
| | | | | 375/240.02 |
| 2015/0237345 | A1* | 8/2015 | Chono | H04N 19/105 |
| | | | | 375/240.02 |
| 2016/0191917 | A1* | 6/2016 | Fu | H04N 19/13 |
| | | | | 375/240.07 |
| 2017/0347128 | A1* | 11/2017 | Panusopone | H04N 19/174 |

OTHER PUBLICATIONS

Marta Mrak et al., "Application of binary context trees in video compression", Picutre Coding Symposium; Apr. 23, 2003-Apr. 25, 2003; Saint Malo, 5 pgs.

David Salomon, "Data Compression the Complete Reference", Jan. 1, 1998, (Springer, New York), pp. A, 38-40, 50-59.

International Search Report and Written Opinion in PCT/US2018/022794, dated Jul. 17, 2018, 15 pp.

Haricharan, Lakshman et al.; "Generalized Interpolation for Motion Compensated Prediction"; 18th IEEE International Conference on Image Processing; 2011; pp. 1213-1216.

Lv, Hao et al.; "A Comparison of Fractional-Pel Interpolation Filters in HEVC and H.264/AVC"; 2013; pp. 1-6.

Bankoski, et al., "Technical Overview of VP8, An Open Source Video Codec for the Web", Jul. 11, 2011, 6 pp.

Bankoski et al, "VP8 Data Format and Decoding Guide", Independent Submission RFC 6389, Nov. 2011, 305 pp.

Bankoski et al, "VP8 Data Format and Decoding Guide draft-bankoski-vp8-bitstream-02", Network Working Group, Internet-Draft, May 18, 2011, 288 pp.

Series H: Audiovisual and Multimedia Systems, Coding of moving video: Implementors Guide for H.264: Advanced video coding for generic audiovisual services, International Telecommunication Union, Jul. 30, 2010, 15 pp.

"Introduction to Video Coding Part 1: Transform Coding", Mozilla, Mar. 2012, 171 pp.

"Overview VP7 Data Format and Decoder", Version 1.5, On2 Technologies, Inc., Mar. 28, 2005, 65 pp.

Series H: Audiovisual and Multimedia Systems, Infrastructure of audiovisual services—Coding of moving video, Advanced video coding for generic audiovisual services, International Telecommunication Union, Version 11, Mar. 2009. 670 pp.

Series H: Audiovisual and Multimedia Systems, Infrastructure of audiovisual services—Coding of moving video, Advanced video coding for generic audiovisual services, International Telecommunication Union, Version 12, Mar. 2010, 676 pp.

Series H: Audiovisual and Multimedia Systems, Infrastructure of audiovisual services—Coding of moving video, Amendment 2: New profiles for professional applications, International Telecommunication Union, Apr. 2007, 75 pp.

Series H: Audiovisual and Multimedia Systems, Infrastructure of audiovisual services—Coding of moving video, Advanced video coding for generic audiovisual services, Version 8, International Telecommunication Union, Nov. 1, 2007, 564 pp.

Series H: Audiovisual and Multimedia Systems, Infrastructure of audiovisual services—Coding of moving video, Advanced video coding for generic audiovisual services, Amendment 1: Support of additional colour spaces and removal of the High 4:4:4 Profile, International Telecommunication Union, Jun. 2006, 16 pp.

Series H: Audiovisual and Multimedia Systems, Infrastructure of audiovisual services—Coding of moving video, Advanced video coding for generic audiovisual services, Version 1, International Telecommunication Union, May 2003, 282 pp.

Series H: Audiovisual and Multimedia Systems, Infrastructure of audiovisual services—Coding of moving video, Advanced video coding for generic audiovisual services, Version 3, International Telecommunication Union, Mar. 2005, 343 pp.

"VP6 Bitstream and Decoder Specification", Version 1.02, On2 Technologies, Inc., Aug. 17, 2006, 88 pp.

"VP6 Bitstream and Decoder Specification", Version 1.03, On2 Technologies, Inc., Oct. 29, 2007, 95 pp.

"VP8 Data Format and Decoding Guide, WebM Project", Google On2, Dec. 1, 2010, 103 pp.

Choong et al., "Efficient Memory Reuse and Sub-Pixel Interpolation Algorithms for ME/MC of H.264/AVC", 2006 IEEE Workshop on Signal Processing Systems Design and Implementation: Banff, Canada, Oct. 2-4, 2006, published Jan. 10, 2006, IEEE, pp. 377-382.

* cited by examiner

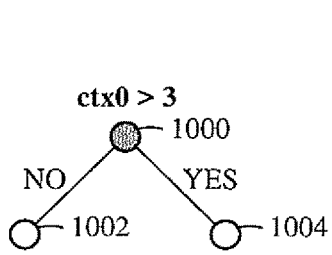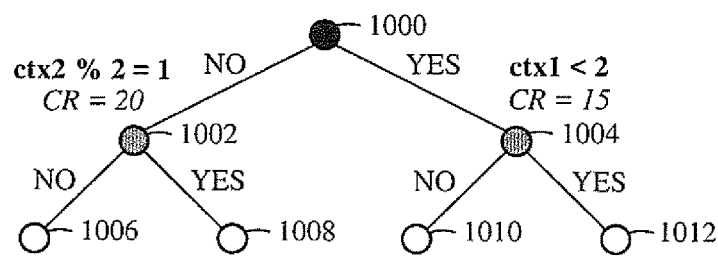
FIG. 10A  FIG. 10B
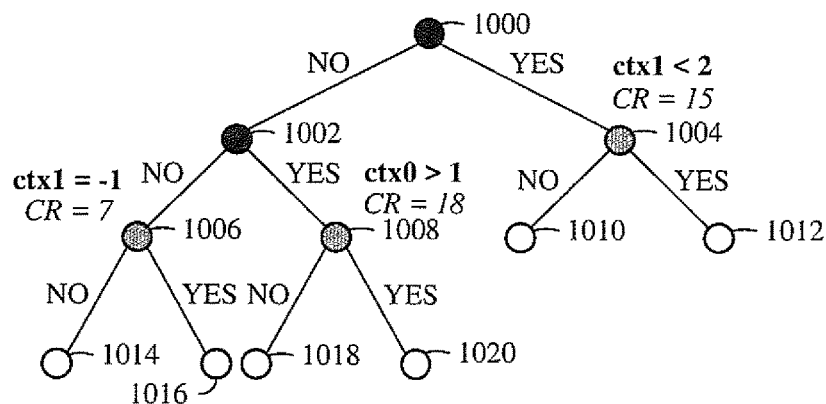
FIG. 10C
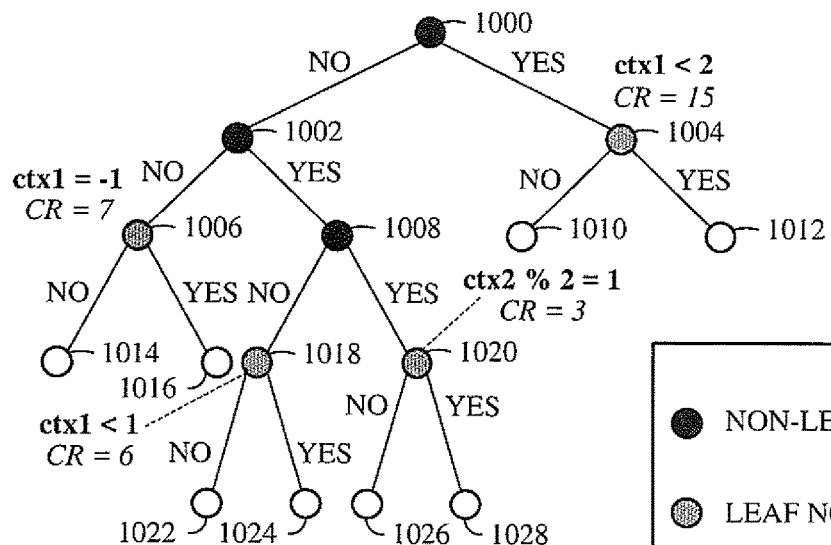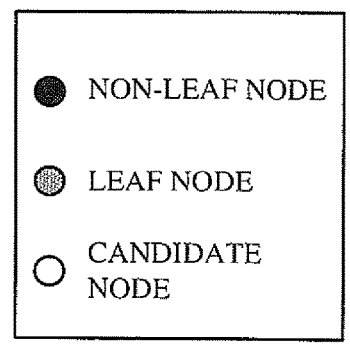
FIG. 10D

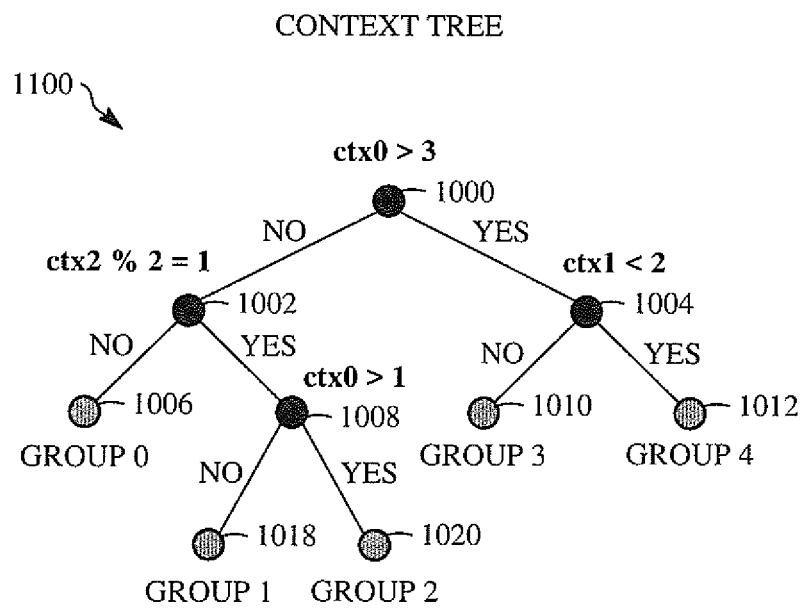
FIG. 11
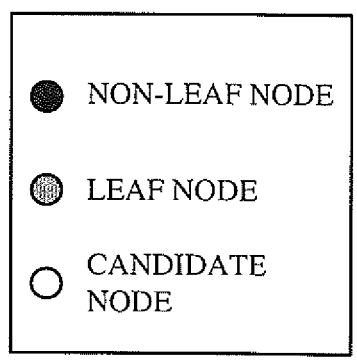

CODING VIDEO SYNTAX ELEMENTS USING A CONTEXT TREE

BACKGROUND

Digital video streams may represent video using a sequence of frames or still images. Digital video can be used for various applications including, for example, video conferencing, high definition video entertainment, video advertisements, or sharing of user-generated videos. A digital video stream can contain a large amount of data and consume a significant amount of computing or communication resources of a computing device for processing, transmission, or storage of the video data. Various approaches have been proposed to reduce the amount of data in video streams, including compression and other encoding techniques.

SUMMARY

A method for decoding an encoded block of an encoded video frame according to one implementation of this disclosure comprises producing a context tree and decoding second syntax elements of the encoded block according to a probability model identified using the context tree. To produce the context tree, first candidate cost reductions resulting from applying separation criteria against context information for first syntax elements of a previously decoded block of the encoded video frame are determined. The syntax elements are separated into a first group of the first syntax elements and a second group of the first syntax elements according to a first separation criterion of the separation criteria resulting in a highest one of the first candidate cost reductions. Second candidate cost reductions resulting from applying the separation criteria against context information for the first group are determined. Third candidate cost reductions resulting from applying the separation criteria against context information for the second group are determined. Responsive to determining that a highest one of the second candidate cost reductions is greater than a highest one of the third candidate cost reductions, the first group is separated into a first subgroup of the first group and a second subgroup of the first group according to a second separation criterion of the separation criteria resulting in the highest one of the second candidate cost reductions.

An apparatus for decoding an encoded block of an encoded video frame according to one implementation of this disclosure comprises a memory and a processor configured to execute instructions stored in the memory to do the following. First candidate cost reductions resulting from an application of separation criteria against context information for first syntax elements of a previously decoded block of the encoded video frame are determined. The syntax elements are separated into a first group of the first syntax elements and a second group of the first syntax elements according to a first separation criterion of the separation criteria resulting in a highest one of the first candidate cost reductions. Second candidate cost reductions resulting from an application of the separation criteria against context information for the first group are determined. Third candidate cost reductions resulting from an application of the separation criteria against context information for the second group are determined. A highest one of the second candidate cost reductions is compared against a highest one of the third candidate cost reductions to determine which is greater. Responsive to a determination that the highest one of the second candidate cost reductions is greater than the highest one of the third candidate cost reductions: the first group is separated into a first subgroup of the first group and a second subgroup of the first group according to a second separation criterion of the separation criteria resulting in the highest one of the second candidate cost reductions; and a context tree including nodes representative of the first syntax elements, the first group, the second group, the first subgroup of the first group, and the second subgroup of the first group is produced. Responsive to a determination that the highest one of the third candidate cost reductions is greater than the highest one of the second candidate cost reductions: the second group is separated into a first subgroup of the second group and a second subgroup of the second group according to a third separation criterion of the separation criteria resulting in the highest one of the second candidate cost reductions; and the context tree including nodes representative of the first syntax elements, the first group, the second group, the first subgroup of the second group, and the second subgroup of the second group is produced. The second syntax elements of the encoded block are then decoded according to a probability model identified using the context tree.

A method for decoding an encoded block of an encoded video frame according to one implementation of this disclosure comprises decoding syntax elements of the encoded block according to a probability model identified using a context tree. The context tree includes a first node representing syntax elements of a previously decoded block of the encoded video frame, a second node representing a first group of the syntax elements, a third node representing a second group of the syntax elements, a fourth node representing a first subgroup of the first group of the syntax elements, and a fifth node representing a second subgroup of the first group of the syntax elements. The syntax elements are separated into the first group and the second group using a separation criterion resulting in a highest candidate cost reduction of a first set of candidate cost reductions, the first set of candidate cost reductions determined by applying separation criteria including the separation criterion against context information of the syntax elements. The first group is separated into the first subgroup and the second subgroup responsive to a determination that a highest candidate cost reduction of a second set of candidate cost reductions is greater than a highest candidate cost reduction of a third set of candidate cost reductions, the second set of candidate cost reductions determined by applying the separation criteria against context information of the first group, the third set of candidate cost reductions determined by applying the separation criteria against context information of the second group.

BRIEF DESCRIPTION OF THE DRAWINGS

The description herein makes reference to the accompanying drawings described below, wherein like reference numerals refer to like parts throughout the several views.

FIG. 10A is an illustration of an example of a first stage for producing a context tree.

FIG. 10B is an illustration of an example of a second stage for producing a context tree.

FIG. 10C is an illustration of an example of a third stage for producing a context tree.

FIG. 10D is an illustration of an example of a fourth stage for producing a context tree.

FIG. 11 is an illustration of an example of a context tree.

DETAILED DESCRIPTION

Figure 1:
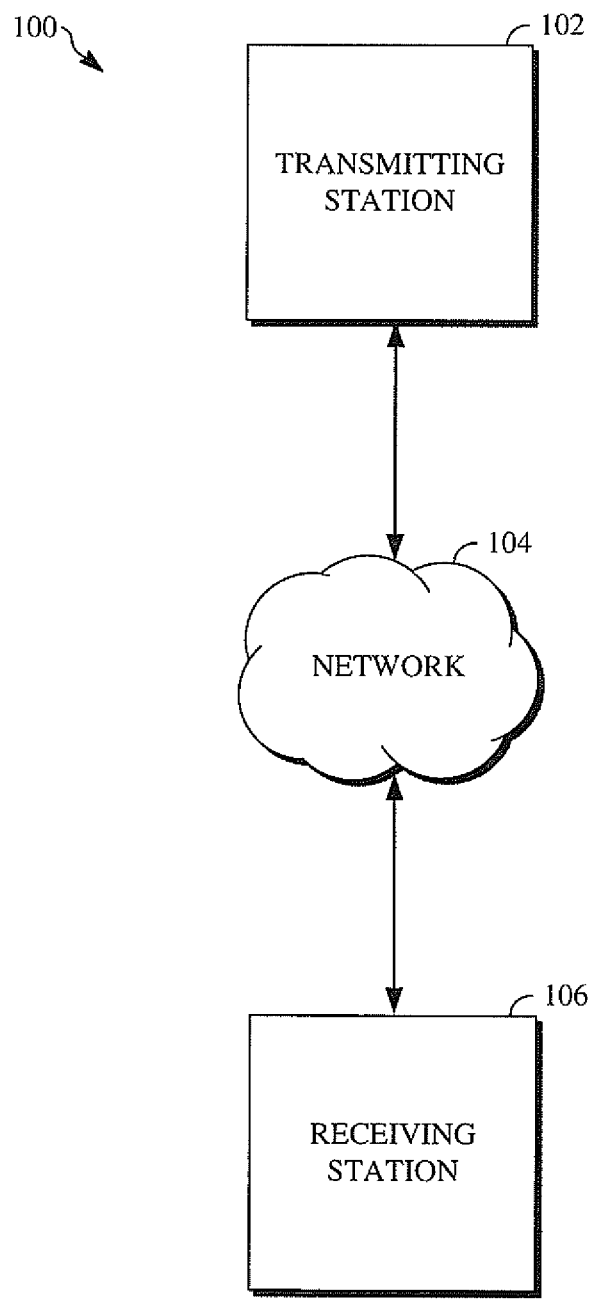
FIG. 1 is a schematic of a video encoding and decoding system.

Video compression schemes may include breaking respective images, or frames, into smaller portions, such as blocks, and generating an encoded bitstream using techniques to limit the encoding of syntax elements associated with the respective blocks thereof. The encoded bitstream can be decoded to re-create the source images from the encoded syntax elements. For example, a video compression scheme can include transforming the prediction residual of a current block of a video stream into transform coefficients of transform blocks. The transform coefficients are quantized and entropy encoded into an encoded bitstream. A decoder uses the encoded transform coefficients to decode or decompress the encoded bitstream to prepare the video stream for viewing or further processing. Syntax elements are elements of data representing all or a portion of a video sequence to be encoded or decoded. For example, a syntax element can be a transform coefficient of a transform block, a motion vector used to generate a prediction residual, a value of a flag within a frame header, or other data associated with the video sequence.

Context information can be used in the entropy encoding and entropy decoding of a syntax element. Examples of context information may refer to a luminance plane, a chrominance plane, a neighboring coefficient, a coefficient position, a transform size, or the like or a combination thereof. A value of context information may refer to how the context information may be used to encode or decode a syntax element. An encoder or decoder can predict the probability distribution of a syntax element based on the context information. That is, a context information can be associated with a probability model indicating how a syntax element has previously been coded, such as for blocks similar to a current block to be encoded or decoded (e.g., based on proximity within a video frame, block size, or the like). By coding a syntax element using an appropriate probability model, the encoder or decoder can respectively encode or decode the syntax element using fewer bits.

However, it may be difficult to determine an appropriate probability model to use where there are a number of syntax elements associated with a block to be encoded or decoded. One solution may include separating the syntax elements associated with a block into different groups based on all combinations of context information. Each group includes a number of the syntax elements that are associated with one combination of context information. The syntax elements may then be coded using a probability model associated with the group including the largest number of the syntax elements.

That solution may have drawbacks, however. For example, the number of groups may increase exponentially as the number of available context information increases. This may cause the entropy coding process to become undesirably costly. In another example, there may be multiple groups, yet each group may contain only a small number of the syntax elements. This over-separating may result in imprecise probability model estimation for the syntax elements that may cause an encoder or decoder to use a suboptimal or inappropriate probability model to respectively encode or decode the syntax elements.

Implementations of this disclosure include using a context tree to code syntax elements associated with a block of a video frame. The syntax elements associated with a block of a video frame may be syntax elements included in the block, included in a header of the video frame that includes the block, or otherwise related to or used for the content or coding of the block. Context information for coding previously-coded syntax elements is identified, and a context tree is produced by separating the previously-coded syntax elements into data groups based on that context information. The context tree includes nodes that represent the data groups and are associated with cost reductions for the previously-coded syntax elements. After the context tree is produced using the previously-coded syntax elements and the context information associated therewith, another set of syntax elements and associated context information can be identified. For example, the previously-coded syntax elements may be syntax elements associated with a first block of a video frame and the other set of syntax elements may be syntax elements associated with a second block of that video frame. A syntax element of the other set of syntax element can be coded by identifying one of the nodes of the context tree, such as based on values of the context information that are associated with that syntax element. That syntax element can then be coded according to a probability model associated with that identified node. As such, the context tree can be used to process further sets of syntax elements, resulting in a lower cost for entropy encoding or entropy decoding.

Further details of techniques for coding syntax elements using a context tree are described herein with initial reference to a system in which they can be implemented. FIG. 1 is a schematic of a video encoding and decoding system 100. A transmitting station 102 can be, for example, a computer having an internal configuration of hardware such as that described in FIG. 2. However, other implementations of the transmitting station 102 are possible. For example, the processing of the transmitting station 102 can be distributed among multiple devices.

A network 104 can connect the transmitting station 102 and a receiving station 106 for encoding and decoding of the video stream. Specifically, the video stream can be encoded in the transmitting station 102, and the encoded video stream can be decoded in the receiving station 106. The network 104 can be, for example, the Internet. The network 104 can also be a local area network (LAN), wide area network (WAN), virtual private network (VPN), cellular telephone network, or any other means of transferring the video stream from the transmitting station 102 to, in this example, the receiving station 106.

Figure 2:
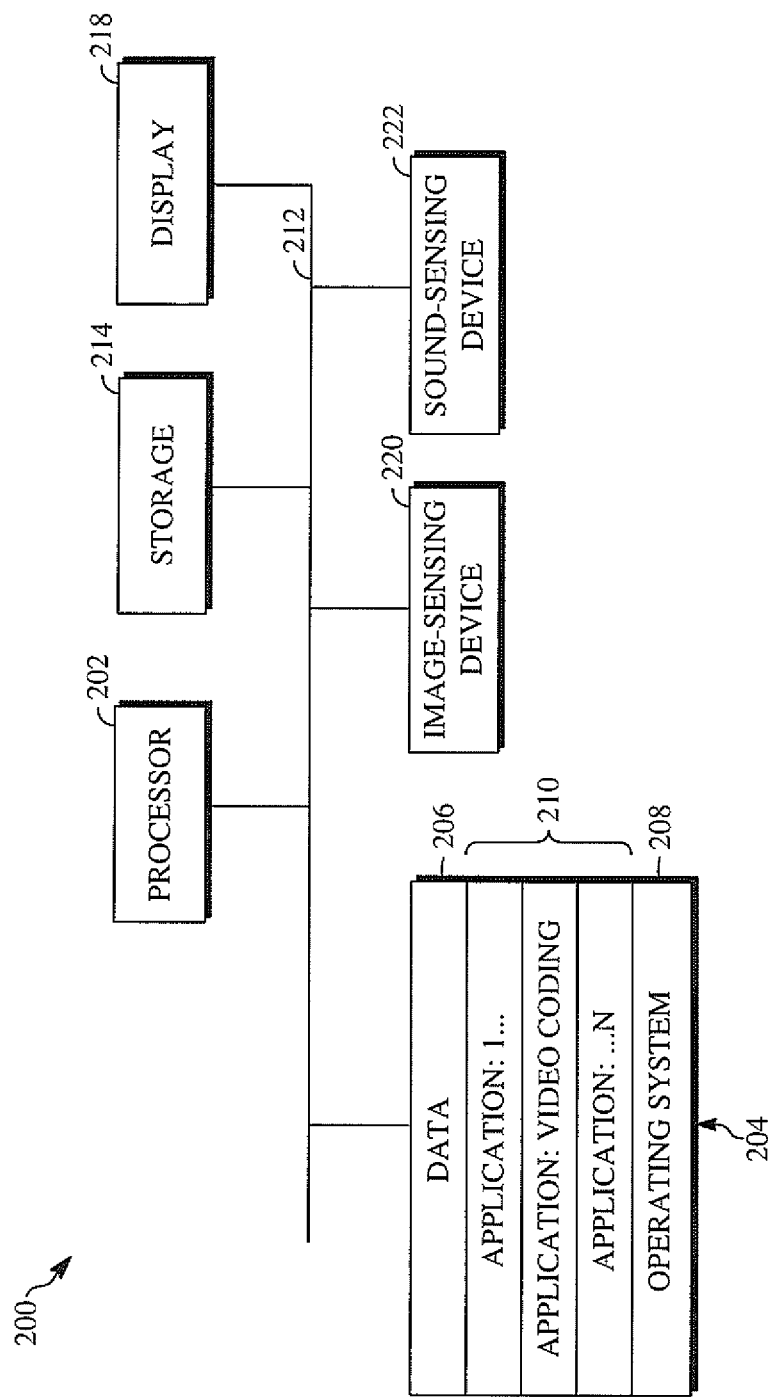
FIG. 2 is a block diagram of an example of a computing device that can implement a transmitting station or a receiving station.

The receiving station 106, in one example, can be a computer having an internal configuration of hardware such as that described in FIG. 2. However, other suitable implementations of the receiving station 106 are possible. For example, the processing of the receiving station 106 can be distributed among multiple devices.

Other implementations of the video encoding and decoding system 100 are possible. For example, an implementation can omit the network 104. In another implementation, a video stream can be encoded and then stored for transmission at a later time to the receiving station 106 or any other device having memory. In one implementation, the receiving station 106 receives (e.g., via the network 104, a computer bus, and/or some communication pathway) the encoded video stream and stores the video stream for later decoding. In an example implementation, a real-time transport protocol (RTP) is used for transmission of the encoded video over the network 104. In another implementation, a transport protocol other than RTP may be used (e.g., a Hypertext Transfer Protocol-based (HTTP-based) video streaming protocol).

When used in a video conferencing system, for example, the transmitting station 102 and/or the receiving station 106 may include the ability to both encode and decode a video stream as described below. For example, the receiving station 106 could be a video conference participant who receives an encoded video bitstream from a video conference server (e.g., the transmitting station 102) to decode and view and further encodes and transmits his or her own video bitstream to the video conference server for decoding and viewing by other participants.

FIG. 2 is a block diagram of an example of a computing device 200 that can implement a transmitting station or a receiving station. For example, the computing device 200 can implement one or both of the transmitting station 102 and the receiving station 106 of FIG. 1. The computing device 200 can be in the form of a computing system including multiple computing devices, or in the form of one computing device, for example, a mobile phone, a tablet computer, a laptop computer, a notebook computer, a desktop computer, and the like.

A processor 202 in the computing device 200 can be a conventional central processing unit. Alternatively, the processor 202 can be another type of device, or multiple devices, capable of manipulating or processing information now existing or hereafter developed. For example, although the disclosed implementations can be practiced with one processor as shown (e.g., the processor 202), advantages in speed and efficiency can be achieved by using more than one processor.

A memory 204 in computing device 200 can be a read only memory (ROM) device or a random access memory (RAM) device in an implementation. However, other suitable types of storage device can be used as the memory 204. The memory 204 can include code and data 206 that is accessed by the processor 202 using a bus 212. The memory 204 can further include an operating system 208 and application programs 210, the application programs 210 including at least one program that permits the processor 202 to perform the techniques described herein. For example, the application programs 210 can include applications 1 through N, which further include a video coding application that performs the techniques described herein. The computing device 200 can also include a secondary storage 214, which can, for example, be a memory card used with a mobile computing device. Because the video communication sessions may contain a significant amount of information, they can be stored in whole or in part in the secondary storage 214 and loaded into the memory 204 as needed for processing.

The computing device 200 can also include one or more output devices, such as a display 218. The display 218 may be, in one example, a touch sensitive display that combines a display with a touch sensitive element that is operable to sense touch inputs. The display 218 can be coupled to the processor 202 via the bus 212. Other output devices that permit a user to program or otherwise use the computing device 200 can be provided in addition to or as an alternative to the display 218. When the output device is or includes a display, the display can be implemented in various ways, including by a liquid crystal display (LCD), a cathode-ray tube (CRT) display, or a light emitting diode (LED) display, such as an organic LED (OLED) display.

The computing device 200 can also include or be in communication with an image-sensing device 220, for example, a camera, or any other image-sensing device 220 now existing or hereafter developed that can sense an image such as the image of a user operating the computing device 200. The image-sensing device 220 can be positioned such that it is directed toward the user operating the computing device 200. In an example, the position and optical axis of the image-sensing device 220 can be configured such that the field of vision includes an area that is directly adjacent to the display 218 and from which the display 218 is visible.

The computing device 200 can also include or be in communication with a sound-sensing device 222, for example, a microphone, or any other sound-sensing device now existing or hereafter developed that can sense sounds near the computing device 200. The sound-sensing device 222 can be positioned such that it is directed toward the user operating the computing device 200 and can be configured to receive sounds, for example, speech or other utterances, made by the user while the user operates the computing device 200.

Although FIG. 2 depicts the processor 202 and the memory 204 of the computing device 200 as being integrated into one unit, other configurations can be utilized. The operations of the processor 202 can be distributed across multiple machines (wherein individual machines can have one or more processors) that can be coupled directly or across a local area or other network. The memory 204 can be distributed across multiple machines such as a network-based memory or memory in multiple machines performing the operations of the computing device 200. Although depicted here as one bus, the bus 212 of the computing device 200 can be composed of multiple buses. Further, the secondary storage 214 can be directly coupled to the other components of the computing device 200 or can be accessed via a network and can comprise an integrated unit such as a memory card or multiple units such as multiple memory cards. The computing device 200 can thus be implemented in a wide variety of configurations.

Figure 3:
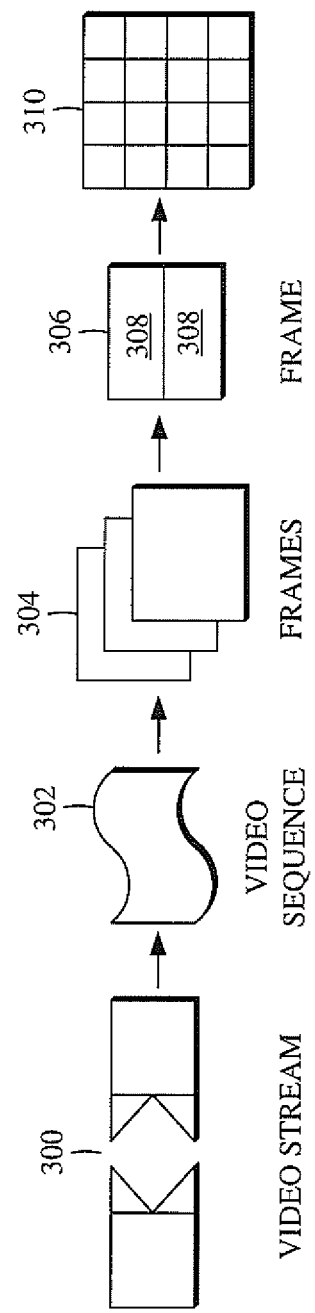
FIG. 3 is a diagram of a typical video stream to be encoded and subsequently decoded.

FIG. 3 is a diagram of an example of a video stream 300 to be encoded and subsequently decoded. The video stream 300 includes a video sequence 302. At the next level, the video sequence 302 includes a number of adjacent frames 304. While three frames are depicted as the adjacent frames 304, the video sequence 302 can include any number of adjacent frames 304. The adjacent frames 304 can then be further subdivided into individual frames, for example, a frame 306. At the next level, the frame 306 can be divided into a series of planes or segments 308. The segments 308 can be subsets of frames that permit parallel processing, for example. The segments 308 can also be subsets of frames that can separate the video data into separate colors. For example, a frame 306 of color video data can include a luminance plane and two chrominance planes. The segments 308 may be sampled at different resolutions.

Whether or not the frame 306 is divided into segments 308, the frame 306 may be further subdivided into blocks 310, which can contain data corresponding to, for example, 16×16 pixels in the frame 306. The blocks 310 can also be arranged to include data from one or more segments 308 of pixel data. The blocks 310 can also be of any other suitable size such as 4×4 pixels, 8×8 pixels, 16×8 pixels, 8×16 pixels, 16×16 pixels, or larger. Unless otherwise noted, the terms block and macroblock are used interchangeably herein.

Figure 4:
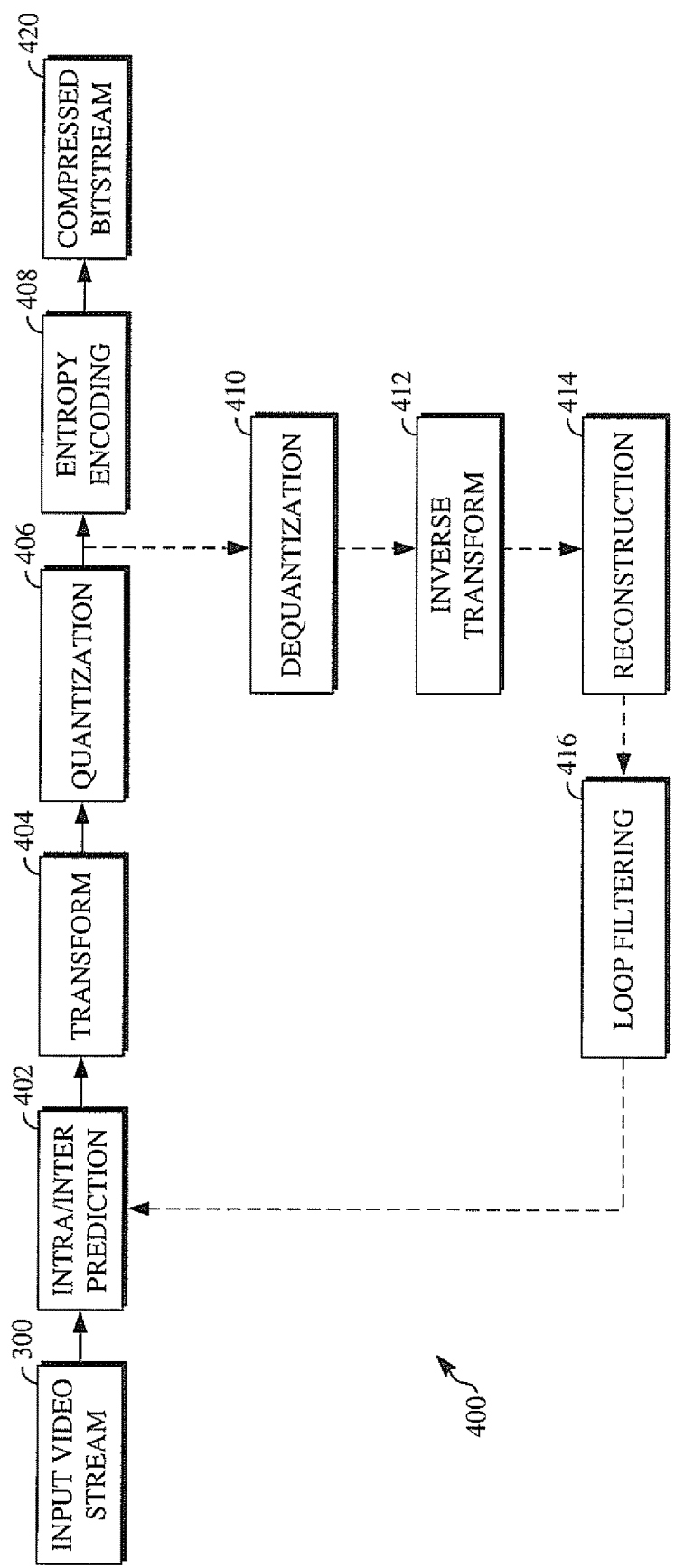
FIG. 4 is a block diagram of an encoder according to implementations of this disclosure.

FIG. 4 is a block diagram of an encoder 400 according to implementations of this disclosure. The encoder 400 can be implemented, as described above, in the transmitting station 102, such as by providing a computer software program stored in memory, for example, the memory 204. The computer software program can include machine instructions that, when executed by a processor such as the processor 202, cause the transmitting station 102 to encode video data in the manner described in FIG. 4. The encoder 400 can also be implemented as specialized hardware included in, for example, the transmitting station 102. In one particularly desirable implementation, the encoder 400 is a hardware encoder.

The encoder 400 has the following stages to perform the various functions in a forward path (shown by the solid connection lines) to produce an encoded or compressed bitstream 420 using the video stream 300 as input: an intra/inter prediction stage 402, a transform stage 404, a quantization stage 406, and an entropy encoding stage 408. The encoder 400 may also include a reconstruction path (shown by the dotted connection lines) to reconstruct a frame for encoding of future blocks. In FIG. 4, the encoder 400 has the following stages to perform the various functions in the reconstruction path: a dequantization stage 410, an inverse transform stage 412, a reconstruction stage 414, and a loop filtering stage 416. Other structural variations of the encoder 400 can be used to encode the video stream 300.

When the video stream 300 is presented for encoding, respective adjacent frames 304, such as the frame 306, can be processed in units of blocks. At the intra/inter prediction stage 402, respective blocks can be encoded using intra-frame prediction (also called intra-prediction) or inter-frame prediction (also called inter-prediction). In any case, a prediction block can be formed. In the case of intra-prediction, a prediction block may be formed from samples in the current frame that have been previously encoded and reconstructed. In the case of inter-prediction, a prediction block may be formed from samples in one or more previously constructed reference frames.

Next, still referring to FIG. 4, the prediction block can be subtracted from the current block at the intra/inter prediction stage 402 to produce a residual block (also called a residual). The transform stage 404 transforms the residual into transform coefficients in, for example, the frequency domain using block-based transforms. The quantization stage 406 converts the transform coefficients into discrete quantum values, which are referred to as quantized transform coefficients, using a quantizer value or a quantization level. For example, the transform coefficients may be divided by the quantizer value and truncated.

The quantized transform coefficients are then entropy encoded by the entropy encoding stage 408. For example, the entropy encoding stage 408 can include identifying context information for encoding syntax elements associated with a current block and producing a context tree by separating the syntax elements into data groups based on the context information. Implementations for identifying the context information and producing the context tree are described below with respect to FIGS. 6-11. The entropy-encoded coefficients, together with other information used to decode the block (which may include, for example, syntax elements such as used to indicate the type of prediction used, transform type, motion vectors, a quantizer value, or the like), are then output to the compressed bitstream 420. The compressed bitstream 420 can be formatted using various techniques, such as variable length coding (VLC) or arithmetic coding. The compressed bitstream 420 can also be referred to as an encoded video stream or encoded video bitstream, and the terms will be used interchangeably herein.

The reconstruction path in FIG. 4 (shown by the dotted connection lines) can be used to ensure that the encoder 400 and a decoder 500 (described below) use the same reference frames to decode the compressed bitstream 420. The reconstruction path performs functions that are similar to functions that take place during the decoding process (described below), including dequantizing the quantized transform coefficients at the dequantization stage 410 and inverse transforming the dequantized transform coefficients at the inverse transform stage 412 to produce a derivative residual block (also called a derivative residual). At the reconstruction stage 414, the prediction block that was predicted at the intra/inter prediction stage 402 can be added to the derivative residual to create a reconstructed block. The loop filtering stage 416 can be applied to the reconstructed block to reduce distortion such as blocking artifacts.

Other variations of the encoder 400 can be used to encode the compressed bitstream 420. In some implementations, a non-transform based encoder can quantize the residual signal directly without the transform stage 404 for certain blocks or frames. In some implementations, an encoder can have the quantization stage 406 and the dequantization stage 410 combined in a common stage.

Figure 5:
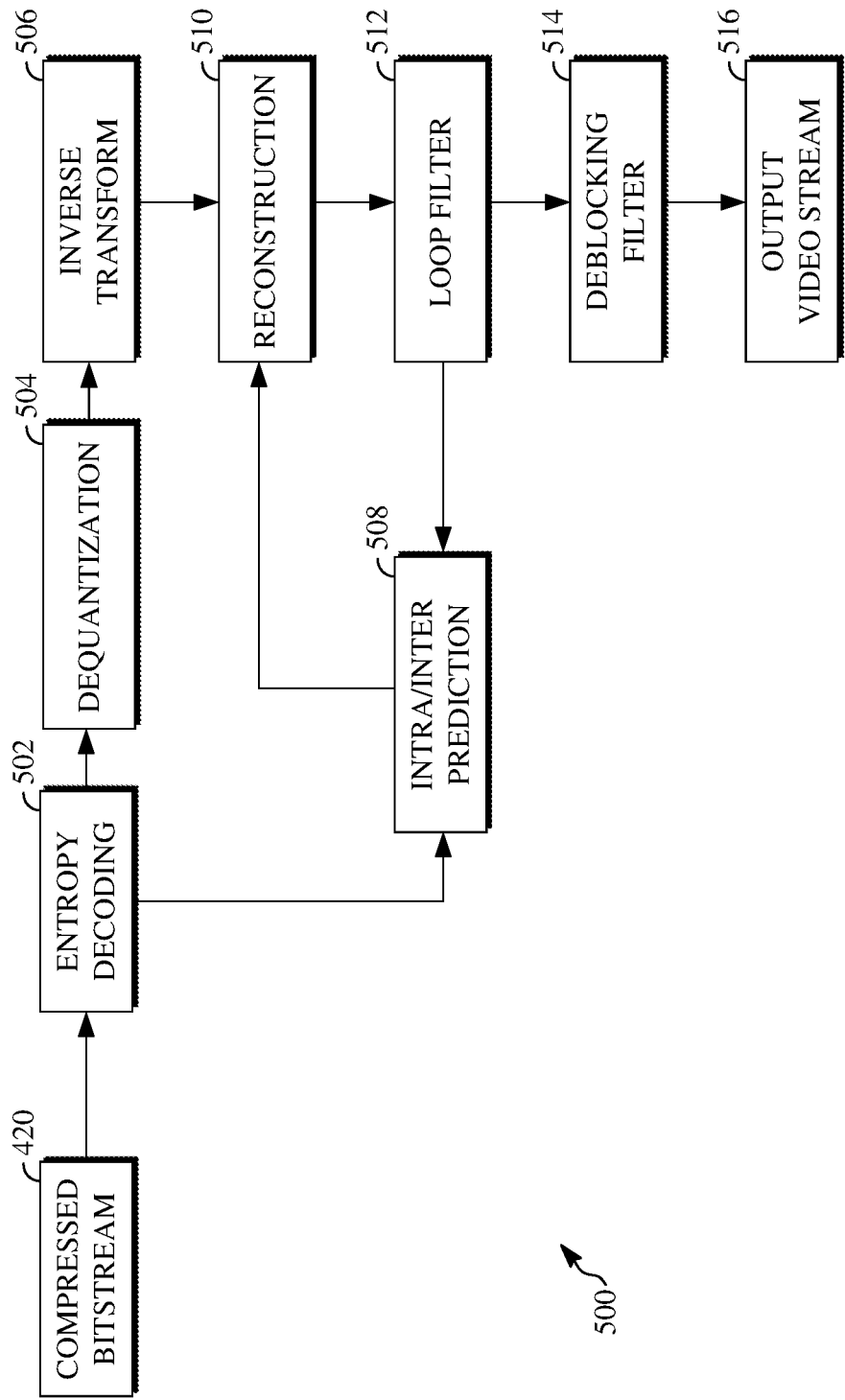
FIG. 5 is a block diagram of a decoder according to implementations of this disclosure.

FIG. 5 is a block diagram of a decoder 500 according to implementations of this disclosure. The decoder 500 can be implemented in the receiving station 106, for example, by providing a computer software program stored in the memory 204. The computer software program can include machine instructions that, when executed by a processor such as the processor 202, cause the receiving station 106 to decode video data in the manner described in FIG. 5. The decoder 500 can also be implemented in hardware included in, for example, the transmitting station 102 or the receiving station 106.

The decoder 500, similar to the reconstruction path of the encoder 400 discussed above, includes in one example the following stages to perform various functions to produce an output video stream 516 from the compressed bitstream 420: an entropy decoding stage 502, a dequantization stage 504, an inverse transform stage 506, an intra/inter prediction stage 508, a reconstruction stage 510, a loop filtering stage 512, and a deblocking filtering stage 514. Other structural variations of the decoder 500 can be used to decode the compressed bitstream 420.

When the compressed bitstream 420 is presented for decoding, the data elements within the compressed bitstream 420 can be decoded by the entropy decoding stage 502 to produce a set of quantized transform coefficients. For example, the entropy decoding stage 502 can include identifying context information for decoding encoded syntax elements associated with an encoded block and producing a context tree by separating the encoded syntax elements into data groups based on the context information. Implementations for identifying the context information and producing the context tree are described below with respect to FIGS. 6-11.

The dequantization stage 504 dequantizes the quantized transform coefficients (e.g., by multiplying the quantized transform coefficients by the quantizer value), and the inverse transform stage 506 inverse transforms the dequantized transform coefficients to produce a derivative residual that can be identical to that created by the inverse transform stage 412 in the encoder 400. Using header information decoded from the compressed bitstream 420, the decoder 500 can use the intra/inter prediction stage 508 to create the same prediction block as was created in the encoder 400, e.g., at the intra/inter prediction stage 402.

At the reconstruction stage 510, the prediction block can be added to the derivative residual to create a reconstructed block. The loop filtering stage 512 can be applied to the reconstructed block to reduce blocking artifacts. Other filtering can be applied to the reconstructed block. In this example, the deblocking filtering stage 514 is applied to the reconstructed block to reduce blocking distortion, and the result is output as the output video stream 516. The output video stream 516 can also be referred to as a decoded video stream, and the terms will be used interchangeably herein. Other variations of the decoder 500 can be used to decode the compressed bitstream 420. In some implementations, the decoder 500 can produce the output video stream 516 without the deblocking filtering stage 514.

Figure 6:
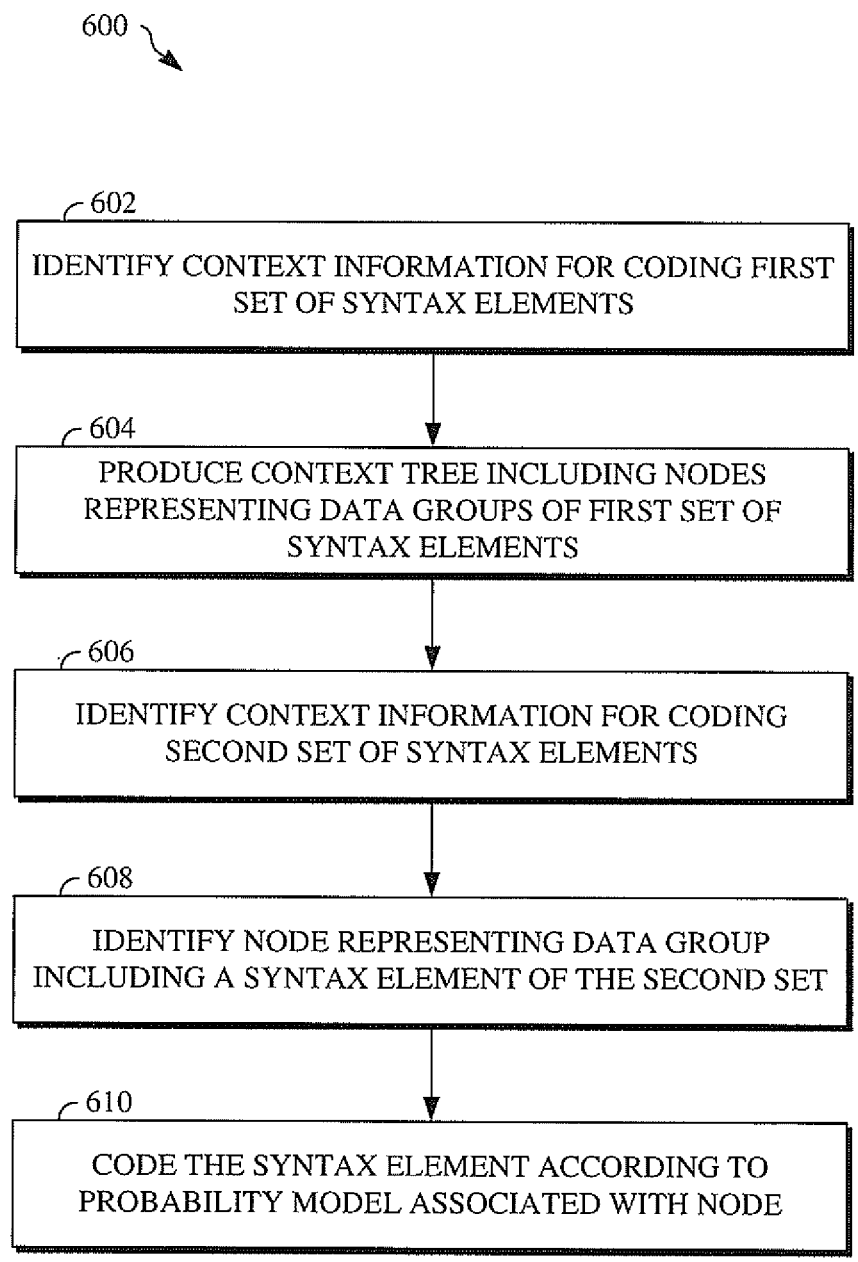
FIG. 6 is a flowchart diagram of a technique for coding syntax elements associated with a block of a video frame.
Figure 7:
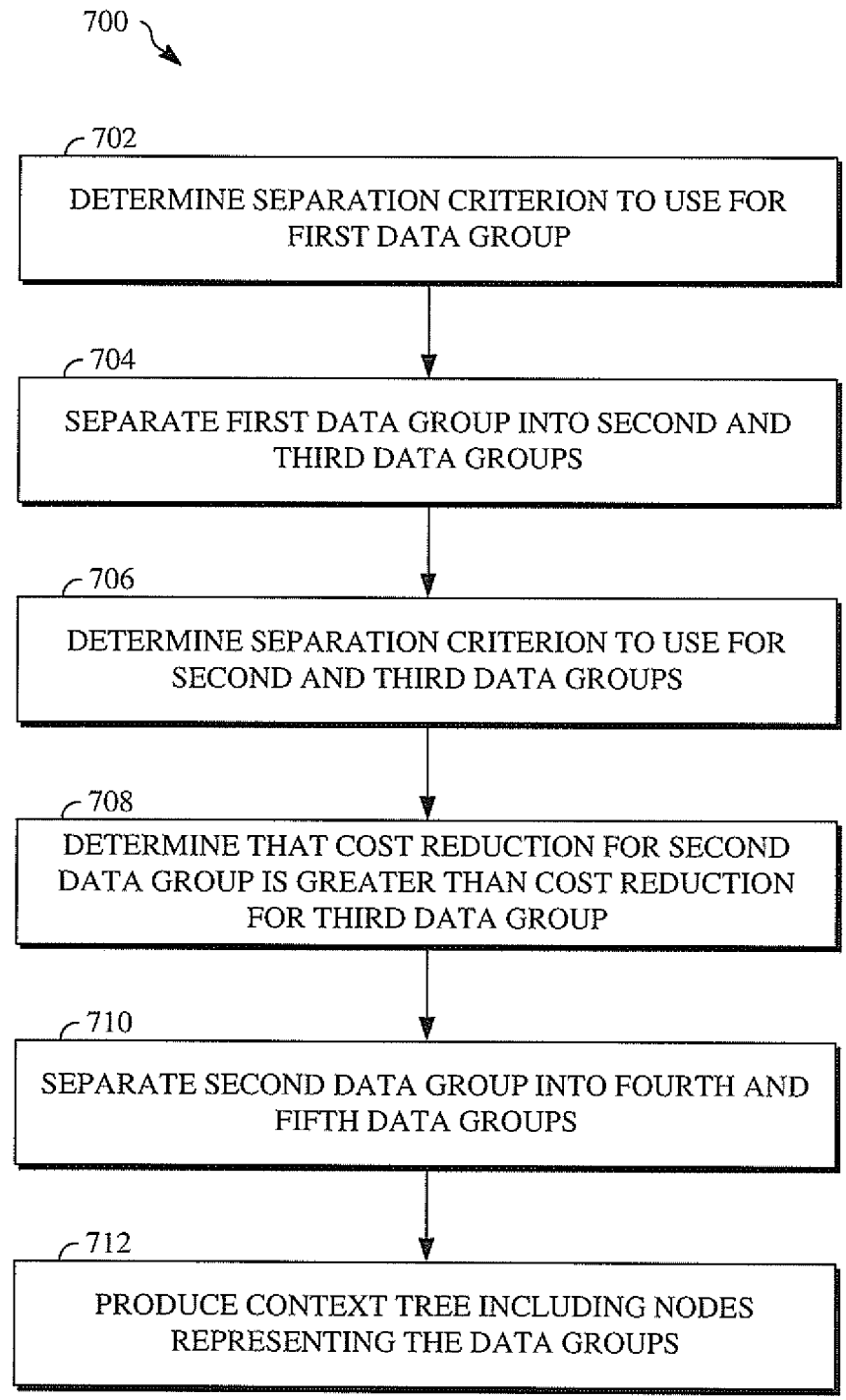
FIG. 7 is a flowchart diagram of a technique for producing a context tree for coding syntax elements associated with a block of a video frame.

Referring next to FIGS. 6-7, techniques for producing a context tree and using a context tree to code syntax elements are described. FIG. 6 is a flowchart diagram of a technique 600 for coding syntax elements associated with a block of a video frame using a context tree. FIG. 7 is a flowchart diagram of a technique 700 for producing a context tree for coding syntax elements associated with a block of a video frame. One or both of the technique 600 or the technique 700 can be implemented, for example, as a software program that may be executed by computing devices such as the transmitting station 102 or the receiving station 106. For example, the software program can include machine-readable instructions that may be stored in a memory such as the memory 204 or the secondary storage 214, and that, when executed by a processor, such as the processor 202, may cause the computing device to perform the technique 600 and/or the technique 700. One or both of the technique 600 or the technique 700 can be implemented using specialized hardware or firmware. As explained above, some computing devices may have multiple memories or processors, and the operations described in one or both of the technique 600 or the technique 700 can be distributed using multiple processors, memories, or both.

One or both of the technique 600 or the technique 700 may be performed by an encoder, for example, the encoder 400 shown in FIG. 4, or by a decoder, for example, the decoder 500 shown in FIG. 5. As such, references within the below descriptions of the technique 600 and the technique 700 may include discussion of encoding a current block or decoding an encoded block, or producing a context tree used to encode a current block or decode an encoded block. While all or a portion of the technique 600 or the technique 700 may be used to encode a current block or decode an encoded block, references to "encoding the current block," or the like, or "decoding the encoded block," or the like, may refer to an applicable operation. For example, when the technique 600 or the technique 700 is used as part of a process for encoding a current block, references to "decoding an encoded block" or the like may be disregarded. Similarly, when the technique 600 or the technique 700 is used as part of a process for decoding an encoded block, references to "encoding a current block" or the like may be disregarded.

Referring first to FIG. 6, a flowchart diagram of a technique 600 for coding syntax elements associated with a block of a video frame using a context tree is shown. At 602, context information for coding a first set of syntax elements associated with a previously-coded block of a video frame is identified. Identifying the context information can include determining the possible values of context information usable to encode or decode the first set syntax elements. During a coding process, an encoder (e.g., the encoder 400 shown in FIG. 4) or a decoder (e.g., the decoder 500 shown in FIG. 5) may be configured to use values of context information within defined sets of context information. The values of each set of context information can reflect different probabilities for coding syntax elements.

For example, there may be N sets of context information available for use by the encoder or decoder. The N sets of context information can be stored within a context buffer available to the encoder or decoder. The values of the sets may reflect default probabilities for coding syntax elements (e.g., a second set of syntax elements associated with a block of the video frame to be coded), probabilities determined based on previous codings of syntax elements (e.g., the first set of syntax elements), or the like. Each set of context information may include different values for the context information of the sets. A value of a first context information of a first set may not be the same as the value of the same first context information of a second set.

Identifying the context information can include generating, receiving, or otherwise identifying a context vector. The context vector includes some or all of the possible values of the context information for coding the syntax elements. The context vector can be represented as a variable, ctx. An index of the context vector, ctx[N], can refer to the possible values of one of the sets of context information. For example, the values stored at ctx[0] can refer to the different values of a first context information. The context information included in the context vector may be stored in a cache.

For example, generating the context vector can include defining a data structure (e.g., an array, object series, or the like) and storing the values of the context information from the different sets of context information within the indices of the data structure. In another example, identifying the context vector can include retrieving a defined data structure from a database or like data store accessible by an encoder or decoder (e.g., the cache within which context information is stored). In yet another example, receiving the context vector can include receiving data indicative of the context vector from a software or hardware component. For example, a server device can include software for transmitting the data to an encoder or decoder. The data can include the context vector or data usable to identify the context vector, such as within a database or like data store.

At 604, a context tree is produced. The context tree can be a binary or non-binary tree including nodes representing data used to code the first set of syntax elements. The nodes of the context tree may be leaf nodes or non-leaf nodes. A leaf node is a node that represents a set or subset of the first set of syntax elements, which set or subset is referred to herein as a data group. A non-leaf node is a node that represents an expression used to separate a data group, which expression is referred to herein as a separation criterion. For example, where the context tree is a binary tree, a non-leaf node is a parent node that may have two child nodes that are both leaf nodes, are both non-leaf nodes, or include one leaf node and one non-leaf node.

Producing the context tree can include separating the first set of syntax elements into data groups based on the identified context information (e.g., the values of the sets of context information within the context vector). The nodes of the context tree are produced to represent the data groups of the first set of syntax elements. Separating the first set of syntax elements can include applying separation criteria against values of the context information to produce ones of the nodes. The separation criteria available for use in producing the context tree may be defined in a list, database, or other data store accessible by the encoder or decoder.

As will be described below, a separation criterion may be applied against a value of the context information to produce one or more nodes responsive to determining that using that separation criterion would result in a greatest cost reduction for the first set of syntax elements. For example, candidate cost reductions can be determined based on applications of different separation criteria to different values of the context information. The separation criterion and corresponding value of context information resulting in the greatest cost reduction are selected for producing one or more new nodes for the context tree.

A node may begin as a leaf node and then change into a non-leaf node. For example, the first level of the context tree may include one node, which is a leaf node representing all of the first set of syntax elements to be coded. A separation criterion can be applied against a value of context information to separate the first set of syntax elements. After the separation criterion is applied, that node becomes a non-leaf node representing the separation criterion that was applied and leaf nodes are produced as child nodes of that non-leaf node. Each of the child nodes represents a data group including a subset of all of the first set of syntax elements. For example, where the context tree is a binary tree, applying a separation criterion to a value of context information for the node of the first level of the context tree includes producing two child nodes of that node. The data groups represented by each of those child nodes may, for example, include one half of the first set of syntax elements. Alternatively, those data groups may include different amounts of the first set of syntax elements.

The nodes of the context tree are associated with cost reductions for the first set of syntax elements (and, for example, subsequent sets of syntax elements coded using the context tree). The context tree is produced to determine a lowest cost for coding the syntax elements associated with a block of a video frame. The cost for coding the syntax elements can depend upon the number of syntax elements to code. The number of syntax elements to code can be represented using a data group. The leaf nodes of the context tree represent different data groups, and, therefore, different possible numbers of syntax elements. As such, a cost to entropy code the syntax elements associated with a block of a video frame can be determined for each leaf node. For example, the cost to entropy code the syntax elements based on a data group represented by a leaf node of the context tree can be calculated using the following formula:

$$\text{cost} = \sum_i e(g_i) + \lambda r(\text{size}(g_i))$$

where $g_i$ is the ith data group, $e(g_i)$ is an entropy cost function of the data group $g_i$, $r(\text{size}(g_i))$ is a size-penalty function having a positive output that decreases with the size of the data group $g_i$, and $\lambda$ is the weighting of the size-penalty function $r(\text{size}(g_i))$. The size-penalty function $r(\text{size}(g_i))$ may, for example, have a domain and codomain of $R^+ \to R^+$. The entropy cost function may be calculated using the following formula:

$$e(g_i) = n_i \sum_k -p_i[k] \log(p_i\{k\})$$

where $n_i$ is length of the data in the data group $g_i$ and $p_i[k]$ is the probability for the syntax elements of the data group $g_i$ that have the syntax value k. Each data group represented by nodes of the context tree may be associated with a probability model.

Producing the context tree can include determining the cost reductions that may result from producing nodes representing separated data groups of the first set of syntax elements. That is, applying a separation criterion on a leaf node results in that leaf node becoming a non-leaf node (e.g., parent node) having two or more child nodes. The cost reduction in determining which nodes to separate using separation criteria is calculated by the cost of the parent node minus the summation of the costs of the resulting child nodes. A context tree being produced may have one or more leaf nodes that may become non-leaf nodes (e.g., parent nodes) using separation criteria. As such, producing the context tree may thus include determining which of the leaf nodes at a given level or a set of the leaf nodes of the context tree, when separated, would result in a highest cost reduction for entropy coding the first set of syntax elements.

Determining to separate a leaf node resulting in the highest cost reduction in a given set of the leaf nodes of the context tree may include determining the cost reduction for entropy coding data groups representing leaf nodes before and after separation criteria are applied to those leaf nodes. The leaf node associated with the highest cost reduction may be separated to produce child nodes; however, as another result, data groups represented by other nodes of the set of leaf nodes may not be separated. Further implementations and examples for producing the context tree are described below with respect to FIG. 7.

At 606, a second set of syntax elements and context information associated therewith are identified. The second set of syntax elements may be associated with a block located in a raster or other scan order after a block including the first set of syntax elements used to produce the context tree. Alternatively, the second set of syntax elements may be associated with a different video frame than the first set of syntax elements used to produce the context tree. The context information to be used for coding the second set of syntax elements can be represented as values of a second context vector. The second context vector may be the same or different from the context vector including the values of context information used for coding the first set of context information.

At 608, one of the nodes of the context tree is identified based on values of the context information associated with one of the syntax elements of the second set of syntax elements. The identified node represents a data group including that syntax element of the second set of syntax elements. Identifying the node based on the values of the context information may, for example, include applying ones of the separation criteria used for separating the syntax elements associated with the previously-coded block (e.g., used to produce the context tree) against values of the second context information that are associated with the syntax element.

For example, where the context tree is a binary tree, values of context information can be resolved against ones of the separation criteria as true or false. A first separation criterion used to separate a first node of a first tree level into second and third nodes of a second tree level may ask whether the value of context information at a first index of a context vector is greater than three. If it is not, the separation criterion used to separate the second node into fourth and fifth nodes of a third tree level may be applied against the values of the context information. If it is, however, the separation criterion used to separate the third node into sixth and seventh nodes of the third tree level may instead be applied against the values of the context information. This process may repeat until one node is identified based on the values of the context information and the separation criteria.

At 610, the syntax element of the second set of syntax elements is coded according to a probability model associated with the identified node. The nodes of the context tree, or, alternatively, the data groups represented by those nodes, are each associated with a probability model. The probability model associated with a node or data group can reflect probabilities for the syntax elements of that node or data group. For example, the probability model may not include probabilities for syntax elements not included in that data group.

A probability model can indicate the probability that the syntax elements associated with a block of a video frame will be certain values, will be present for that block or frame, or the like. For example, a probability model can include integer values reflecting the different probabilities that may be associated with one or more of the syntax elements. A maximum value can be defined for the probability model such that a given probability for a syntax element can be represented as a percentage derived by dividing an integer value with the maximum value. For example, the maximum value for a probability model can be in the scale of 256. A probability for a syntax element can reflect the value 119. The probability model would thus indicate that there is a 119/256 probability associated with that syntax element.

Coding the syntax element of the second set of syntax elements according to the probability model associated the identified node can include, during an encoding process, encoding the syntax element of the second set of syntax elements according to the probability model or decoding the syntax element of the second set of syntax elements according to the probability model. The probabilities associated with the identified probability model are processed using entropy coding (e.g., at the entropy encoding stage 408 shown in FIG. 4 or the entropy decoding stage 502 shown in FIG. 5). For example, arithmetic coding can be used to encode or decode syntax elements having probabilities meeting a threshold value, such that a syntax element may not be encoded or decoded when the probability thereof is too low.

The arithmetic coding can thus be performed to limit the total number of syntax elements encoded to a bitstream, such as to minimize the total size of the bitstream, the cost in transmitting the bitstream, or the like. As such, during an encoding operation, and after the arithmetic coding is performed against the second set of syntax elements according to the identified probability model, the second set of syntax elements is encoded by being compressed into an encoded bitstream. Alternatively, during a decoding operation, and after the arithmetic coding is performed against the second set of syntax elements according to the identified probability model, the second set of syntax elements is decoded by being decompressed from an encoded bitstream.

In some implementations, the technique 600 can include updating the context tree using the second set of syntax elements and then using the updated context tree to code the second set of syntax elements. For example, the probability model associated with the nodes of the context tree can be recalculated, such as based on the second set of syntax elements and the context information associated therewith. The second set of syntax elements can then be coded based on the recalculated probability model. For example, the recalculated cost reductions can be used to separate a leaf node, such as to change that leaf node into non-leaf node associated with a cost reduction, thereby resulting in an estimated lowest cost for coding the second set of syntax elements.

In some implementations, the context tree may be produced based on data received within an encoded bitstream. For example, where the technique 600 is performed to decode encoded syntax elements, data indicative of the context tree can received at the decoder within an encoded bitstream transmitted from an encoder, a relaying device, or another computing device. The encoded bitstream includes an encoded video frame, and the encoded video frame includes the encoded block with which the encoded syntax elements are associated. The context tree can thus be produced based on information received, for example, from an encoder. For example, the data used to produce the bitstream can include data indicating the separation criteria applied to respective ones of the context information for decoding the encoded syntax elements.

In some implementations, the syntax elements associated with the block may be encoded or decoded using data stored in a cache. For example, the data stored in the cache can indicate separations of the syntax elements into data groups. The separations can be used, for example, to produce a context tree, to update a context tree, or to verify that a current context tree is consistent with the indicated separations.

In some implementations, the probability model according to which the syntax elements are coded can be updated. For example, the probability model can be updated responsive to encoding or decoding a final block of the video frame. Updating the probability model can include counting a number of times that a syntax element is associated with blocks of the video frame. For example, that number can be updated responsive to each applicable block being encoded or decoded. The probability model can be updated based on the total number resulting after a final block of the video frame is encoded or decoded. For example, if the count is higher than a threshold, the probability model can be updated to reflect that the probability that the syntax element is a certain value or is present has increased. If the count is lower than the threshold, the probability model can be updated to reflect that that probability has decreased. The threshold can be, for example, a total count of that syntax element for a previous video frame.

Updates to the probability model can be independently made by each of an encoder and decoder. For example, the encoder and the decoder can separately store probability models usable for encoding and decoding syntax elements according to the techniques of this disclosure. Alternatively, updates to the probability model can be determined at the encoder and communicated to the decoder. For example, the encoder can update the probabilities associated with a probability model after a video frame is encoded so that those updated probabilities can be synchronized with the decoder and used to decode the encoded video frame.

In some implementations, identifying the context information for coding the syntax elements associated with the block can include selecting one of the sets of context information to be used to code the syntax elements. The encoder may be configured to select one of the N sets available to it and generate, receive, or otherwise identify a context vector based only on the possible values of that selected set. For example, the encoder may select the set of context information that has been most used for coding syntax elements associated with other blocks of the same video frame. In another example, the encoder may select the set of context information that was used to code the syntax elements by a most recently-encoded block of the video frame. The context vector would not include values of other sets of context information. As such, each index of the context vector would reflect a single value of the selected set of context information.

In some implementations, an encoder or decoder can determine whether the types of context information within a set of context information are relevant for coding the syntax elements associated with the block before determining the values thereof. For example, it may be the case that one or more of the types of context information within a set does not relate to or otherwise provide meaningful information usable to encode or decode a syntax element associated with the block. The encoder or decoder may not determine a value for an irrelevant type of context information or otherwise include or use the irrelevant type of context information within the context vector. In some implementations, the decoder may not be configured to generate a context vector. For example, the values of the context information used to encode the syntax elements may be communicated from the encoder to the decoder, such as using a context vector. The decoder can use the values included in the context vector received from the encoder to decode the syntax elements.

Referring next to FIG. 7, a flowchart diagram of a technique 700 for producing a context tree for coding syntax elements associated with a block of a video frame is shown. The technique 700 may include one or more of the operations of the technique 600 shown in FIG. 6, such as those performed at 604. As such, the technique 700 may be performed as part of a technique for coding syntax elements associated with a block of a video frame, for example, the technique 600. Alternatively, the technique 700 may be performed separately from a technique for coding syntax elements. For example, the operations for producing the context tree may be independent of the operations for coding syntax elements. This may be the case, for example, where the context tree is produced using a sample set of syntax elements and then trained to update the context tree before the context tree itself is used to code syntax elements.

At 702, a separation criterion to use for a first data group is determined. The first data group may be a data group including all of the syntax elements to encode or decode using the context tree to be produced. The separation criterion may be one multiple separation criteria usable to evaluate the context information. For example, an encoder or decoder may have access to a list of separation criteria, which may, for example, be stored in a database or other data store. Each separation criterion of the list may include an expression that, depending on the type of the context tree, can return a numerical value, a range of numerical values, or a binary value. For example, where the context tree is a binary tree, each separation criterion may include an express that, when applied to a value of context information, returns as true or false.

Determining the separation criterion to apply to the first data group can include applying different separation criteria against different values of context information for a plurality of the syntax elements to encode or decode to determine candidate cost reductions. Each candidate cost reduction can represent one separation criterion and the corresponding value of context information to which it is applied. The candidate cost reductions can be compared to determine the highest cost reduction thereof. The separation criterion resulting in that highest cost reduction can be then be determined as the separation criterion to use for the first data group. For example, determining the candidate cost reductions can include performing a breadth-first search against nodes of the context tree that have already been produced to identify one or more candidate data groups to separate. Different ones of the candidate cost reductions would thus be associated with different ones of the one or more candidate data groups.

At 704, the first data group is separated into a second data group and a third data group using the determined separation criterion. For example, where the context tree is a binary tree, separating the first data group into the second and third data groups using the determined separation criterion can include determining which of the syntax elements of the first data group that resolve as true when the separation criterion is used and which instead resolve as false. For example, the second data group can include those syntax elements of the first data group resolving as true, and the third data group can include those syntax elements of the first data group resolving as false. The first data group can be represented in a context tree using a first node. Separating the first data group can thus include producing a second node representing the second data group within the context tree and producing a third node representing the third data group within the context tree.

At 706, separation criterion to use for each of the second and third data groups are determined. Determining the separation criterion to use for the second data group includes determining a set of candidate cost reductions resulting from applying the different separation criteria against different values of the context information for a first portion of the syntax elements for which the candidate cost reductions were determined, resulting in the separation of the first data group into the second and third data groups. The separation criterion that results in the highest candidate cost reduction is selected for the second data group. Determining the separation criterion to use for the third data group also includes determining a set of candidate cost reductions resulting from applying the different separation criteria against different values of the context information for a second portion of the syntax elements for which the candidate cost reductions were determined, resulting in the separation of the first data group into the second and third data groups. The separation criterion that results in the highest candidate cost reduction is selected for the third data group. The first portion and the second portion of the syntax elements for which the candidate cost reductions resulting in the separation of the first data group may be different portions of those syntax elements. Alternatively, the first portion and the second portion may share some or all of the syntax elements for which the candidate cost reductions resulting in the separation of the first data group.

At 708, the highest cost reduction resulting from using the separation criterion selected for the second data group is compared to the highest cost reduction resulting from using the separation criterion selected for the third data group. For example, based on that comparison, a determination can be made that the highest cost reduction resulting from using the separation criterion selected for the second data group is greater than the highest cost reduction resulting from using the separation criterion selected for the third data group.

At 710, and responsive to the determination that the highest cost reduction resulting from using the separation criterion selected for the second data group is greater than the highest cost reduction resulting from using the separation criterion selected for the second data group, the second data group can be separated. For example, the second data group can be separated into a fourth data group and a fifth data group using the separation criterion selected for the second data group. Separating the second data group can further include producing a node representing the fourth data group within the context tree and producing a node representing the fifth data group within the context tree.

At 712, a context tree is produced including the nodes representing the first, second, third, fourth, and fifth data groups. Producing the context tree can include producing the nodes described above. For example, the node representing the first data group may not be produced upon or before separating the first data group into the second and third data groups. Similarly, the node representing the fourth data group may not be produced upon or before separating the second data group into the fourth and fifth data groups. Instead, all of those nodes may be produced at simultaneously or near-simultaneously after the separations of the data groups has completed. Alternatively, producing the context tree can include associating nodes already produced (e.g., upon or before respective separations of data groups) with a context tree.

In some implementations, the technique 700 can include determining whether the combined cost to entropy code the second and third data groups would be less than the cost to entropy code the first data group before separating the first data group into the second and third data groups. For example, determining a separation criterion to apply against a value of context information can include calculating a cost to entropy code each of the first data group, the second data group, and the third data group. A comparison can then be performed between the cost to entropy code the first data group and the combined cost to entropy code the second and third data groups. For example, if a determination is made that the combined cost to entropy code the data groups represented by the nodes to be is not less than the cost to entropy code the data group that will be separated to produce those nodes, those nodes may not be produced.

In some implementations, the comparison between the cost to entropy code the first data group and the combined cost to entropy code the second and third data groups can be performed after nodes are produced as part of the separating of a data group. For example, if a determination is made that the combined cost to entropy code the data groups represented by newly produced nodes is not less than the cost to entropy code the data group separated to produce those nodes, those newly produced nodes may be removed from the context tree.

In some implementations, a data group is separated into two or more data groups based on the amount of the cost reduction resulting from applying a separation criterion to a value of the context information. For example, the separation of a data group can be responsive to a determination that a highest candidate cost reduction meets a reduction threshold. The reduction threshold may be an integer, float, or other value representing a minimum decrease in the cost to code the syntax elements associated with a block. If that minimum decrease is not met by the application of a separation criterion to a value of the context information, the data group may not be separated. For example, the reduction threshold may be used to prevent computational resources from being expended without an improvement to the coding efficiency of the syntax elements associated with the block.

Figure 8:
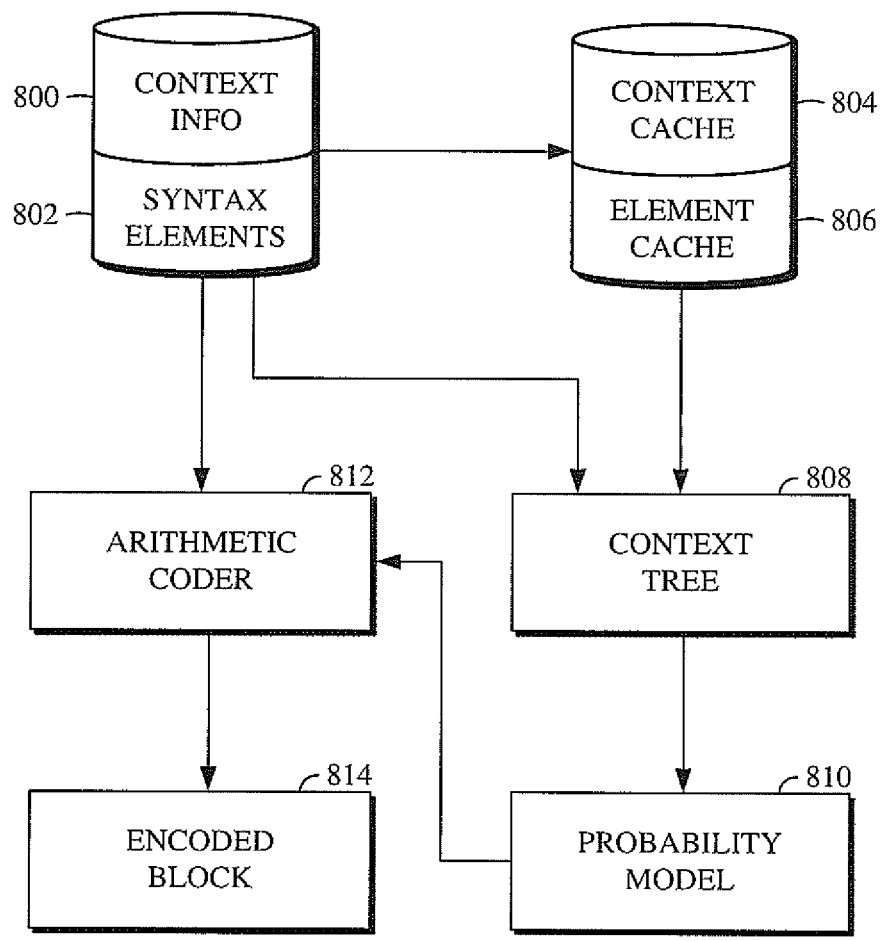
FIG. 8 is a block diagram of a system for encoding syntax elements associated with a current block of a video frame.
Figure 9:
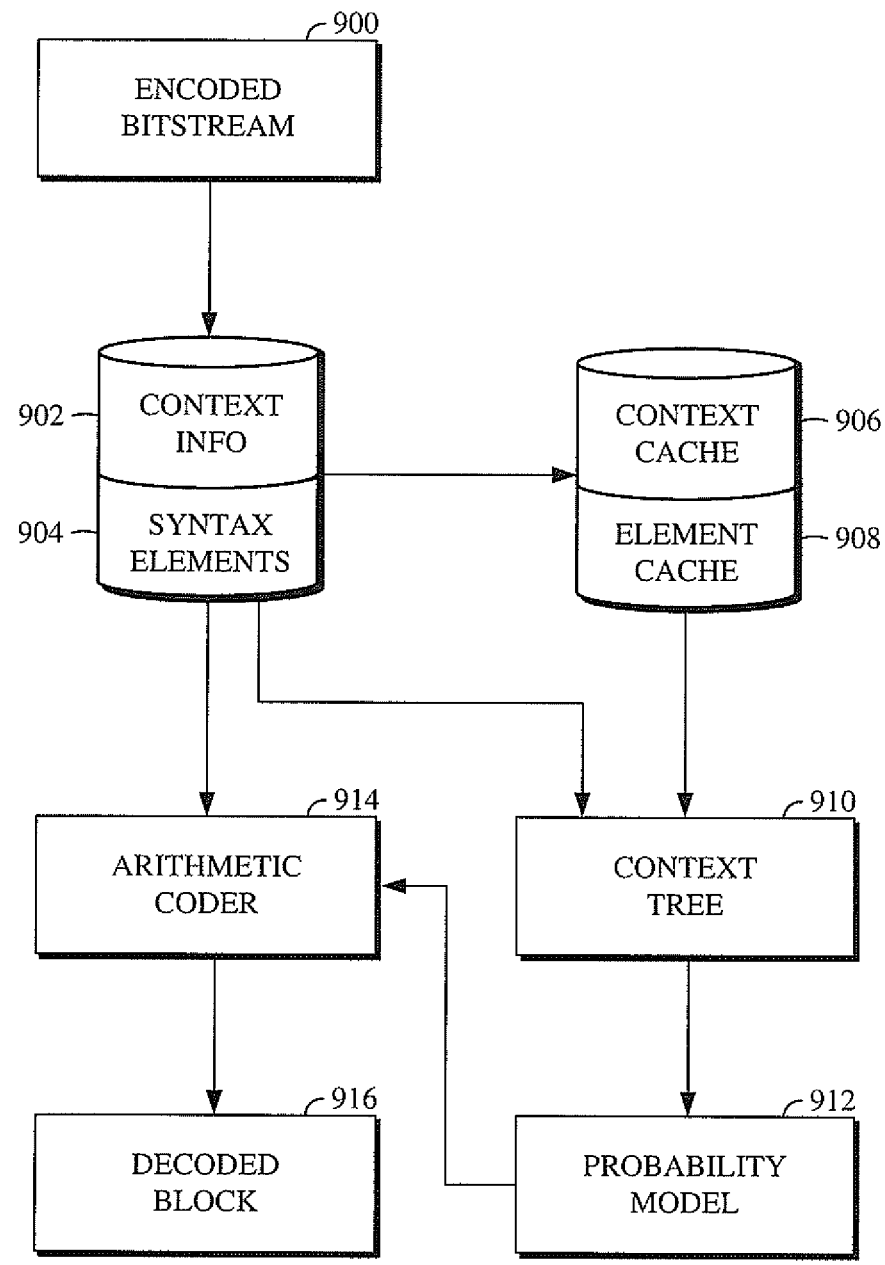
FIG. 9 is a block diagram of a system for decoding encoded syntax elements associated with an encoded block of an encoded video frame.

Referring next to FIGS. 8-9, systems for coding syntax elements using a context tree are described. The systems shown in FIGS. 8-9 may include using all or a portion of one or both of the technique 600 shown in FIG. 6 or the technique 700 shown in FIG. 7. For example, the systems may represent hardware and/or software components used to perform all or a portion of one or both of the technique 600 or the technique 700.

FIG. 8 is a block diagram of a system for encoding syntax elements associated with a current block of a video frame. The system for encoding the syntax elements may, for example, be implemented by or using an encoder, such as the encoder 400 shown in FIG. 4. The system includes context information 800 corresponding to previously-coded syntax elements 802. The context information 800 can be one or more sets of context information defined for use by the encoder. The context information 800 may include a context vector that is generated, received, or otherwise identified based on values of the sets of context information. The syntax elements 802 are syntax elements associated with a block to be encoded.

The context information 800 and the previously-coded syntax elements 802 are respectively cached in a context cache 804 and a syntax element cache 806. The data stored in the context cache 804 and the syntax element cache 806 are then used as input for producing a context tree 808. For example, a context vector included in the context information 800 can be cached into the context cache 804 and then be received by a software component configured to produce the context tree 808. For example, the values of context information included in the context vector can be used with separation criterion available to the encoder to produce the context tree 808 based on the lowest costs for encoding ones of the syntax elements in the syntax element cache 806. After the context tree 808 is produced, a probability model 810 can be estimated for respective leaf nodes in the context tree based on the data groups represented by those leaf nodes. The probability model is used to encode incoming syntax elements (e.g., syntax elements associated with a second block of a video frame, such as where the syntax elements 802 used to produce the context tree 808 are associated with a first block of that video frame). For example, the previously-coded syntax elements 802 can refer to a first set of syntax elements associated with a first block of a video frame and the incoming syntax elements can refer to a second set of syntax elements associated with a second block of a video frame, such as a current block to be encoded. To encode an incoming syntax element, a context information (e.g., of the context information 800) corresponding to that incoming syntax element can be identified. That context information can then be applied to identify a node of the context tree 808 that will result in a lowest cost for encoding that incoming syntax element. The probability model 810 associated with that identified node of the context tree 808 can then be identified. The probability model 810 can be one of multiple probability models stored in a probability table of probabilities for the different context information available to the encoder. Identifying the probability model 810 can include querying the probability table, for example, using information associated with the identified node of the context tree 808.

The context information corresponding to the incoming syntax elements to be encoded is thus passed to the context tree 808 to request or otherwise identify the probability model 810. The probability model 810 is then passed along to an arithmetic coder 812. The arithmetic coder 812 can be a software module or like component configured to perform arithmetic coding using the probabilities of the probability model 810. The incoming syntax elements are also passed along to the arithmetic coder 812. The arithmetic coder 812 then entropy encodes the incoming syntax elements according to the probability model 810. As a result of the entropy encoding by the arithmetic coder 812, an encoded block 814 is produced. The encoded block 814 includes the incoming syntax elements in an encoded form. The encoded block 814 may be included in an encoded bitstream, such as the compressed bitstream 420 shown in FIG. 4.

The context cache 804 and the syntax element cache 806 can store the syntax elements 802 and the corresponding context information 800 that has been encoded. The context cache 804 and the syntax element cache 806 can be used for producing the context tree 808. The context cache 804 and the syntax element cache 806 can be used to update the existing context tree 804 when subsequent sets of syntax elements are received and cached in the syntax element cache 806 or otherwise identified for encoding. The syntax element cache 806 may be a cache for storing the syntax elements 802, the incoming syntax elements, and/or other sets of syntax elements that have been encoded. For example, a subsequent set of syntax elements can be compared to syntax elements stored in the syntax element cache 806. If a match is determined with information stored in the syntax element cache 806, the context tree 808 can be used without modification.

FIG. 9 is a block diagram of a system for decoding encoded syntax elements associated with an encoded block of an encoded video frame. The system for decoding the encoded syntax elements may, for example, be implemented by or using an decoder, such as the decoder 500 shown in FIG. 5. An encoded bitstream 900 represents a video stream and includes encoded blocks of the video stream. For example, the encoded bitstream 900 can be the compressed bitstream 420 shown in FIG. 4. An encoded block of the encoded bitstream 900 may, for example, be the encoded block 810 shown in FIG. 8.

The system uses context information 902 corresponding to previously-coded syntax elements 904. The context information 902 can be one or more sets of context information defined for use by the decoder. The context information 902 and the previously-coded syntax elements 904 are respective cached in a context cache 906 and a syntax element cache 908. The data stored in the context cache 906 and the syntax element cache 908 can be used as input for producing a context tree 910. For example, the context information 902 may include a context vector that is generated, received, or otherwise identified based on values of the sets of context information. For example, the context vector may be received from an encoder. The context vector is cached into the context cache 906. The syntax elements 904 are previously-coded syntax elements used along with the context information 902 to produce the context tree 910. The context tree 910 may be the context tree 808 shown in FIG. 8. For example, the context tree 910 may be produced in the same way as the context tree 808 was produced. In another example, the context tree 808 may be communicated to the decoder for use in decoding syntax elements as the context tree 910. The produced context tree 910 is then used to identify a probability model for decoding incoming syntax elements (e.g., syntax elements associated with a second encoded block of an encoded video frame, such as where the syntax elements 904 used to produce the context tree 910 are associated with a first encoded block of that encoded video frame). For example, the previously-coded syntax elements 904 can refer to a first set of syntax elements associated with a first block of a video frame and the incoming syntax elements can refer to a second set of syntax elements associated with a second block of a video frame, such as an encoded block to be decoded.

A probability model 912 is identified based on the context tree 910, such as in the same manner as described above with respect to the probability model 810 shown in FIG. 8 (e.g., by passing context information corresponding to the incoming syntax elements to be decoded to the context tree 910 to identify the probability model 912). The probability model 912 is then passed along to an arithmetic coder 914 to decode the incoming syntax elements. For example, the arithmetic coder 914 may be a software module or like component configured to entropy decode the incoming syntax elements using the probabilities of the probability model 912. A decoded block 916 is produced responsive to the arithmetic coder 914 entropy decoding the incoming syntax elements using the probabilities of the probability model 912. The decoded block 916 may then be output as part of a video stream, for example, the output video stream 516 shown in FIG. 5.

The context cache 906 and the syntax element cache 908 can store the syntax elements 904 and the corresponding context information 902 that has been decoded. The context cache 906 and the syntax element cache 908 can be used for producing the context tree 910. The context cache 906 and the syntax element cache 908 can be used to update the existing context tree 910 when subsequent sets of encoded syntax elements are received and cached in the syntax element cache 908 or otherwise identified for decoding. The syntax element cache 908 may be a cache for storing the syntax elements 904, the incoming syntax elements, and/or other sets of encoded syntax elements before they have been decoded. For example, a subsequent set of encoded syntax elements can be compared to encoded syntax elements stored in the syntax element cache 908. If a match is determined with information stored in the syntax element cache 908, the context tree 910 can be used without modification.

Referring next to FIGS. 10A-11, the production of an example context tree is described. Thee example context tree produced as shown in FIGS. 10A-11 can be produced by performing all or a portion of one or both of the technique 600 shown in FIG. 6 or the technique 700 shown in FIG. 7. Further, the example context tree produced as shown in FIGS. 10A-11 can be produced using one or both of the systems shown in FIGS. 8-9. For example, the example context tree can be produced by an encoder using the system shown in FIG. 8 or a decoder using the system shown in FIG. 9. The encoder or decoder can produce the tree as part of a technique for coding syntax elements, for example, based on the technique 600. Alternatively, the encoder or decoder can produce the tree independently of the coding of syntax elements, for example, based on the technique 700.

FIG. 10A is an illustration of an example of a first stage for producing a context tree. For example, FIG. 10A shows the production of a first level of an example context tree. A node 1000 is a leaf node representing a data group including all of the syntax elements associated with a block to be encoded or decoded. The data group represented by the node 1000 can be separated into data groups to be represented by a node 1002 and a node 1004 by applying a separation criterion against a value of context information. As described above, the particular separation criterion and value of context information resulting in the separation of the node 1000 can be determined based on candidate cost reductions determined based on applications of different separation criteria against different values of context information. The node 1000 is separated by applying the separation criterion of greater than three to a value of the context information located at a [0] index of a context vector.

FIG. 10B is an illustration of an example of a second stage for producing a context tree. For example, FIG. 10B shows the production of a second level of the example context tree. The nodes 1002 and 1004 are produced responsive to the separation of the data group represented the node 1000 at the first stage shown in FIG. 10A. The data group represented by the node 1000 is separated into data groups to be represented by the nodes 1002 and 1004 responsive to a determination that the combined cost to code the syntax elements included in the data groups to be represented by the nodes 1002 and 1004 is less than the cost to code the syntax elements included in the data group represented by the node 1000.

The nodes 1002 and 1004 are leaf nodes. The node 1000 becomes a non-leaf node responsive to the production of the nodes 1002 and 1004. The node 1002 represents a data group including some of the syntax elements associated with the block to be encoded or decoded. The node 1004 represents a data group including the rest of those syntax elements. The data group represented by the node 1002 can be separated into a data group represented by a node 1006 and a data group represented by a node 1008. The data group represented by the node 1004 can be separated into a data group represented by a node 1010 and a data group represented by a node 1012.

A separation criterion is selected for separating the data group represented by the node 1002. That separation criterion includes the expression remainder two is less than one and is applied against a value of context information located at a [2] index of the context vector. The cost reduction resulting from using that separation criterion for the node 1002 is 20. A different separation criterion is selected for separating the data group represented by the node 1004. That separation criterion includes the expression less than two and is applied against a value of context information located at a [1] index of the context vector. The cost reduction from using that separation criterion for the node 1004 is 15. As such, the cost reduction that would result from separating the data group represented by the node 1002 into data groups to be represented by the nodes 1006 and 1008 is greater than the cost reduction that would result from separating the data group represented by the node 1004 into data groups to be represented by the nodes 1010 and 1012.

FIG. 10C is an illustration of an example of a third stage for producing a context tree. For example, FIG. 10C shows the production of a third level of the example context tree. The nodes 1006 and 1008 are produced responsive to the separation of the data group represented by the node 1002 at the second stage shown in FIG. 10B. The data group represented by the node 1002 is separated into data groups to be represented by the nodes 1006 and 1008 responsive to a determination that the combined cost to code the syntax elements included in the data groups to be represented by the nodes 1006 and 1008 is less than the cost to code the syntax elements included in the data group represented by the node 1002.

The nodes 1006 and 1008 are leaf nodes. The node 1002 becomes a non-leaf node responsive to the production of the nodes 1006 and 1008. The node 1006 represents a data group including some of the syntax elements included in the data group represented by the node 1002. The node 1008 represents a data group including the rest of those syntax elements. The data group represented by the node 1006 can be separated into a data group represented by a node 1014 and a data group represented by a node 1016. The data group represented by the node 1008 can be separated into a data group represented by a node 1018 and a data group represented by a node 1020.

A separation criterion is selected for separating the data group represented by the node 1006. That separation criterion includes the expression remainder equals to negative one and is applied against a value of context information located at a [1] index of the context vector. The cost reduction resulting from using that separation criterion for the node 1006 is 7. A different separation criterion is selected for separating the data group represented by the node 1008. That separation criterion includes the expression greater than one and is applied against a value of context information located at a [0] index of the context vector. The cost reduction from using that separation criterion for the node 1008 is 18. As such, the cost reduction that would result from separating the data group represented by the node 1008 into data groups represented by the nodes 1018 and 1020 is greater than the cost reduction that would result from separating the data group represented by the leaf node 1006 into data groups represented by the nodes 1014 and 1018 and is also greater than the cost reduction that would result from separating the data group represented by the leaf node 1004 into data groups represented by the nodes 1010 and 1012.

FIG. 10D is an illustration of an example of a fourth stage for producing a context tree. For example, FIG. 10D shows the production of a fourth level of the example context tree. The nodes 1018 and 1020 are produced responsive to the separation of the data group represented by the node 1008 at the third stage shown in FIG. 10C. The data group represented by the node 1008 is separated into data groups to be represented by the nodes 1018 and 1020 responsive to a determination that the combined cost to code the syntax elements included in the data groups to be represented by the nodes 1018 and 1020 is less than the cost to code the syntax elements included in the data group represented by the node 1008.

The nodes 1018 and 1020 are leaf nodes. The node 1008 becomes a non-leaf node responsive to the production of the nodes 1018 and 1020. The node 1018 represents a data group including some of the syntax elements included in the data group represented by the node 1008. The node 1020 represents a data group including the rest of those syntax elements. The data group represented by the node 1018 can be separated into a data group represented by a node 1022 and a data group represented by a node 1024. The data group represented by the node 1020 can be separated into a data group represented by a node 1026 and a data group represented by a node 1028.

A separation criterion is selected for separating the data group represented by the node 1018. That separation criterion includes the expression remainder less one and is applied against a value of context information located at a [1] index of the context vector. The cost reduction resulting from using that separation criterion for the node 1018 is 6.

A different separation criterion is selected for separating the data group represented by the node 1020. That separation criterion includes the expression remainder two equals one and is applied against a value of context information located at a [2] index of the context vector. The cost reduction from using that separation criterion for the node 1020 is 3.

As such, the cost reduction that would result from separating the data group represented by the node 1018 into data groups represented by the nodes 1022 and 1024 is greater than the cost reduction that would result from separating the data group represented by the node 1020 into data groups represented by the nodes 1026 and 1028. However, a determination can then be made that the combined cost to code the syntax elements included in the data groups to be represented by the nodes 1022 and 1024 is not significantly less than the cost to code the syntax elements included in the data group represented by the node 1018. As a result of that determination, the data group represented by the node 1018 is not separated and no nodes are produced at a fifth level of the example context tree.

FIG. 11 is an illustration of an example of a context tree 1100. The context tree 1100 is a binary tree including the nodes 1000, 1002, 1004, 1006, 1008, 1010, 1012, 1018, and 1020 produced at the first, second, third, and fourth stages shown in FIGS. 10A-10D. For example, although not described above, the nodes 1010 and 1012 may be produced responsive to a determination that the combined cost to code the syntax elements included in the data groups to be represented by the nodes 1010 and 1012 is less than the cost to code the syntax elements included in the data group represented by the node 1004.

The context tree 1100 may be used for subsequent codings of syntax elements. Alternatively, the context tree 1100 may be trained before it is used to code syntax elements without further modification. For example, the context tree 1100 may have been produced based on N syntax elements. Another N syntax elements may be used to train the context tree 1100 to verify that the coding efficiency for those N syntax elements is improved over the first N syntax elements. Thereafter, the context tree 1100 may be used for further codings of subsequent syntax elements without further modification.

Implementations of the context tree 1100 shown in FIG. 11 may include additional, less, or different functionality than as shown and described. In some implementations, the context tree may be a non-binary tree. For example, a separation criterion applied to context information may return multiple branches in the context tree, such as where each branch corresponds to a range of possible values for satisfying the separation criterion. For example, a binary version of a separation criterion may ask whether a value of context information at a first index of a context vector is less than three. The tree may include two branches based on that separation criterion, wherein one branch leads to a node representing a data group where the value of that context information is less than three and the other branch leads to a node representing a data group where the value of that context information is not less than three.

However, a non-binary version of that separation criterion may ask what the value of the context information at the first index of the context vector is. For example, a first branch based on that separation criterion may lead to a node representing a data group where the value of that context information is zero to one, another such branch may lead to a node representing a data group where the value of that context information is two to three, and another such branch may lead to a node representing a data group where the value of that context information is four to five. In some implementations, there may be a configurable or non-configurable limit to the maximum number of branches resulting from the application of a non-binary separation criterion to a value of context information.

The aspects of encoding and decoding described above illustrate some examples of encoding and decoding techniques. However, it is to be understood that encoding and decoding, as those terms are used in the claims, could mean compression, decompression, transformation, or any other processing or change of data.

The word "example" is used herein to mean serving as an example, instance, or illustration. Any aspect or design described herein as "example" is not necessarily to be construed as being preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise or clearly indicated otherwise by the context, the statement "X includes A or B" is intended to mean any of the natural inclusive permutations thereof. That is, if X includes A; X includes B; or X includes both A and B, then "X includes A or B" is satisfied under any of the foregoing instances. In addition, the articles "a" and "an" as used in this application and the appended claims should generally be construed to mean "one or more," unless specified otherwise or clearly indicated by the context to be directed to a singular form. Moreover, use of the term "an implementation" or the term "one implementation" throughout this disclosure is not intended to mean the same embodiment or implementation unless described as such.

Implementations of the transmitting station 102 and/or the receiving station 106 (and the algorithms, methods, instructions, etc., stored thereon and/or executed thereby, including by the encoder 400 and the decoder 500) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably. Further, portions of the transmitting station 102 and the receiving station 106 do not necessarily have to be implemented in the same manner.

Further, in one aspect, for example, the transmitting station 102 or the receiving station 106 can be implemented using a general purpose computer or general purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

The transmitting station 102 and the receiving station 106 can, for example, be implemented on computers in a video conferencing system. Alternatively, the transmitting station 102 can be implemented on a server, and the receiving station 106 can be implemented on a device separate from the server, such as a handheld communications device. In this instance, the transmitting station 102, using an encoder 400, can encode content into an encoded video signal and transmit the encoded video signal to the communications device. In turn, the communications device can then decode the encoded video signal using a decoder 500. Alternatively, the communications device can decode content stored locally on the communications device, for example, content that was not transmitted by the transmitting station 102. Other suitable transmitting and receiving implementation schemes are available. For example, the receiving station 106 can be a generally stationary personal computer rather than a portable communications device, and/or a device including an encoder 400 may also include a decoder 500.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or semiconductor device. Other suitable mediums are also available.

The above-described embodiments, implementations, and aspects have been described in order to facilitate easy understanding of this disclosure and do not limit this disclosure. On the contrary, this disclosure is intended to cover various modifications and equivalent arrangements included within the scope of the appended claims, which scope is to be accorded the broadest interpretation as is permitted under the law so as to encompass all such modifications and equivalent arrangements.

What is claimed is:

1. A method for decoding an encoded block of an encoded video frame, the method comprising:
    producing a context tree by:
        determining first candidate cost reductions resulting from applying separation criteria against context information for first syntax elements of a previously decoded block of the encoded video frame;
        separating the syntax elements into a first group of the first syntax elements and a second group of the first syntax elements according to a first separation criterion of the separation criteria resulting in a highest one of the first candidate cost reductions;
        determining second candidate cost reductions resulting from applying the separation criteria against context information for the first group;
        determining third candidate cost reductions resulting from applying the separation criteria against context information for the second group;
        responsive to determining that a highest one of the second candidate cost reductions is greater than a highest one of the third candidate cost reductions, separating the first group into a first subgroup of the first group and a second subgroup of the first group according to a second separation criterion of the separation criteria resulting in the highest one of the second candidate cost reductions; and
    decoding second syntax elements of the encoded block according to a probability model identified using the context tree.

2. The method of claim 1, wherein the context tree includes:
    a first node representing the first syntax elements;
    a second node representing the first group;
    a third node representing the second group;
    a fourth node representing the first subgroup; and
    a fifth node representing the second subgroup,
    wherein the first node and the second node are non-leaf nodes, and
    wherein the third node, the fourth node, and the fifth node are leaf nodes.

3. The method of claim 2, wherein a plurality of nodes of the context tree includes the first node, the second node, the third node, the fourth node, and the fifth node, the method further comprising:
    identifying, based on context information associated with a syntax element of the second syntax elements, a node of the plurality of nodes that represents a group or subgroup of the first syntax elements which includes the syntax element of the second syntax elements; and
    identifying the probability model using the identified node.

4. The method of claim 3, wherein identifying the node of the plurality of nodes that represents the group of the first syntax elements which includes the syntax element of the second syntax elements comprises:
    applying the first separation criterion or the second separation criterion against the context information associated with the syntax element of the second syntax elements.

5. The method of claim 2, further comprising:
    updating the context tree by recalculating cost reductions for one or more nodes of the plurality of nodes based on the second syntax elements; and
    decoding third syntax elements of a second encoded block using the updated context tree.

6. The method of claim 1, wherein separating the syntax elements into the first group and the second group according to the first separation criterion of the separation criteria resulting in the highest one of the first candidate cost reductions comprises:
    separating the syntax elements into the first group and the second group responsive to determining that the highest one of the first candidate cost reductions meets a reduction threshold.

7. The method of claim 1, wherein determining the first candidate cost reductions resulting from applying the separation criteria against the context information for the first syntax elements comprises:
    performing a breadth-first search against nodes of the context tree to identify a node representing the first syntax elements.

8. An apparatus for decoding an encoded block of an encoded video frame, the apparatus comprising:
    a memory; and
    a processor configured to execute instructions stored in the memory to:
        determine first candidate cost reductions resulting from an application of separation criteria against context information for first syntax elements of a previously decoded block of the encoded video frame;
        separate the syntax elements into a first group of the first syntax elements and a second group of the first syntax elements according to a first separation criterion of the separation criteria resulting in a highest one of the first candidate cost reductions;
        determine second candidate cost reductions resulting from an application of the separation criteria against context information for the first group;
        determine third candidate cost reductions resulting from an application of the separation criteria against context information for the second group;

compare a highest one of the second candidate cost reductions against a highest one of the third candidate cost reductions to determine which is greater;

responsive to a determination that the highest one of the second candidate cost reductions is greater than the highest one of the third candidate cost reductions:

separate the first group into a first subgroup of the first group and a second subgroup of the first group according to a second separation criterion of the separation criteria resulting in the highest one of the second candidate cost reductions; and produce a context tree including nodes representative of the first syntax elements, the first group, the second group, the first subgroup of the first group, and the second subgroup of the first group; and responsive to a determination that the highest one of the third candidate cost reductions is greater than the highest one of the second candidate cost reductions:

separate the second group into a first subgroup of the second group and a second subgroup of the second group according to a third separation criterion of the separation criteria resulting in the highest one of the second candidate cost reductions; and produce the context tree including nodes representative of the first syntax elements, the first group, the second group, the first subgroup of the second group, and the second subgroup of the second group; and decode second syntax elements of the encoded block according to a probability model identified using the context tree.

9. The apparatus of claim 8, wherein the instructions include instructions to:

identify, based on context information associated with a syntax element of the second syntax elements, a node that represents a group or subgroup of the first syntax elements which includes the syntax element of the second syntax elements; and identify the probability model using the identified node.

10. The apparatus of claim 9, wherein the instructions to identify the node that represents the group or subgroup of the first syntax elements which includes the syntax element of the second syntax elements include instructions to:

apply a separation criterion of the separation criteria against the context information associated with the syntax element of the second syntax elements.

11. The apparatus of claim 8, wherein a cost to entropy decode a syntax element of the second syntax elements is calculated based on:

an entropy cost function of a group or subgroup of the first syntax elements which includes the syntax element of the second syntax elements;

a size-penalty function having a positive output that decreases with a size of the group or subgroup of the first syntax elements; and a weighting of the size-penalty function.

12. The apparatus of claim 11, wherein the entropy cost function is calculated based on:

a length of data in the group or subgroup of the first syntax elements; and a probability that syntax elements included in the group or subgroup of the first syntax elements have a specified value.

13. A method for decoding an encoded block of an encoded video frame, the method comprising:

decoding syntax elements of the encoded block according to a probability model identified using a context tree, the context tree including:

a first node representing syntax elements of a previously decoded block of the encoded video frame;

a second node representing a first group of the syntax elements;

a third node representing a second group of the syntax elements;

a fourth node representing a first subgroup of the first group of the syntax elements; and a fifth node representing a second subgroup of the first group of the syntax elements, wherein the syntax elements are separated into the first group and the second group using a separation criterion resulting in a highest candidate cost reduction of a first set of candidate cost reductions, the first set of candidate cost reductions determined by applying separation criteria including the separation criterion against context information of the syntax elements, and wherein the first group is separated into the first subgroup and the second subgroup responsive to a determination that a highest candidate cost reduction of a second set of candidate cost reductions is greater than a highest candidate cost reduction of a third set of candidate cost reductions, the second set of candidate cost reductions determined by applying the separation criteria against context information of the first group, the third set of candidate cost reductions determined by applying the separation criteria against context information of the second group.

14. The method of claim 13, further comprising:

producing the context tree based on data encoded to an encoded bitstream including the encoded video frame.

15. The method of claim 13, wherein a plurality of nodes of the context tree includes the first node, the second node, the third node, the fourth node, and the fifth node, the method further comprising:

identifying, based on context information associated with a syntax element of the syntax elements of the encoded block, a node of the plurality of nodes that represents a group or subgroup of the syntax elements of the previously decoded block which includes the syntax element of the syntax elements of the encoded block; and identifying the probability model using the identified node.

16. The method of claim 15, wherein the separation criterion is a first separation criterion, wherein identifying the node of the plurality of nodes that represents the group of the first syntax elements which includes the syntax element of the second syntax elements comprises:

applying the first separation criterion or a second separation criterion of the separation criteria against the context information associated with the syntax element of the syntax elements of the encoded block.

17. The method of claim 15, further comprising:

updating the context tree by recalculating cost reductions for one or more nodes of the plurality of nodes based on the second syntax elements; and decoding syntax elements of a second encoded block using the updated context tree.

18. The method of claim 13, further comprising:

separating the syntax elements of the previously decoded block into the first group and the second group responsive to determining that the highest one of the first set of candidate cost reductions meets a reduction threshold.

19. The method of claim 13, wherein a cost to entropy decode a syntax element of the syntax elements of the encoded block is calculated based on:
   an entropy cost function of a group or subgroup of the syntax elements of the previously decoded block which includes the syntax element of the syntax elements of the encoded block;
   a size-penalty function having a positive output that decreases with a size of the group or subgroup of the syntax elements of the previously decoded block; and
   a weighting of the size-penalty function.

20. The method of claim 19, wherein the entropy cost function is calculated based on:
   a length of data in the group or subgroup of the syntax elements of the previously decoded block; and
   a probability that syntax elements included in the group or subgroup of the syntax elements of the previously decoded block have a specified value.

* * * * *